US012495677B2

United States Patent
Cho et al.

(10) Patent No.: US 12,495,677 B2
(45) Date of Patent: Dec. 9, 2025

(54) DISPLAY DEVICE AND DISPLAY PANEL INCLUDING TWO OR MORE SUBPIXELS DISPOSED IN THE NON-TRANSMISSION AREA OF THE OPTICAL AREA AND DISPLAY PANEL HAVING THE SAME

(71) Applicant: LG DISPLAY CO., LTD., Seoul (KR)

(72) Inventors: Youngsung Cho, Gyeonggi-do (KR); Byeong-Seong So, Seoul (KR)

(73) Assignee: LG Display Co., Ltd., Seoul (KR)

( * ) Notice: Subject to any disclaimer, the term of this patent is extended or adjusted under 35 U.S.C. 154(b) by 559 days.

(21) Appl. No.: 17/951,983

(22) Filed: Sep. 23, 2022

(65) Prior Publication Data

US 2023/0157072 A1 May 18, 2023

(30) Foreign Application Priority Data

Nov. 17, 2021 (KR) .................. 10-2021-0158661

(51) Int. Cl.
*H01L 29/08* (2006.01)
*H10D 86/40* (2025.01)
*H10D 86/60* (2025.01)
*H10K 59/121* (2023.01)
*H10K 59/126* (2023.01)
*H10K 59/131* (2023.01)
*H10K 59/35* (2023.01)
(Continued)

(52) U.S. Cl.
CPC ....... *H10K 59/1213* (2023.02); *H10D 86/441* (2025.01); *H10D 86/60* (2025.01); *H10K 59/1216* (2023.02); *H10K 59/126* (2023.02); *H10K 59/131* (2023.02); *H10K 59/353* (2023.02); *H10K 59/40* (2023.02); *H10K 59/65* (2023.02)

(58) Field of Classification Search
CPC ............ H10K 59/1213; H10K 59/353; H10K 59/131; H10K 59/40
USPC ......................................... 257/40
See application file for complete search history.

(56) References Cited

U.S. PATENT DOCUMENTS 11,469,284 B2   10/2022  Kim
2018/0040682 A1  2/2018  Ebisuno et al.
(Continued)

FOREIGN PATENT DOCUMENTS

CN   110289296 A    9/2019
CN   112885843 A  *  6/2021
(Continued)

OTHER PUBLICATIONS

The Japan Patent Office, Notice of Allowance, Japanese Patent Application No. 2022-170762, Apr. 9, 2024, six pages.

*Primary Examiner* — Phuc T Dang
(74) *Attorney, Agent, or Firm* — Fenwick & West LLP

(57) ABSTRACT

A display device is disclosed. The display device comprises a display panel including an optical area and a normal area in a display area, and an optical electronic device overlapping at least a portion of the optical area. Two or more subpixels and a lower shield metal may be disposed in a non-transmission area between adjacent transmission areas in the optical area. In the non-transmission area of the optical area, the lower shield metal may include at least one opening overlapping all or a portion of a specific transistor among two or more transistors included in each of the two or more subpixels disposed in the non-transmission area in the optical area.

18 Claims, 33 Drawing Sheets

(51) Int. Cl.
 *H10K 59/40* (2023.01)
 *H10K 59/65* (2023.01)

(56) References Cited

U.S. PATENT DOCUMENTS

| | | |
|---|---|---|
| 2021/0020704 A1 | 1/2021 | Kim |
| 2021/0233976 A1 | 7/2021 | Lee |
| 2021/0249495 A1 | 8/2021 | Lee et al. |
| 2022/0165824 A1* | 5/2022 | Kim .................... H10D 86/423 |
| 2023/0031774 A1 | 2/2023 | Kim |

FOREIGN PATENT DOCUMENTS

| | | | | |
|---|---|---|---|---|
| CN | 113363293 A | * | 9/2021 | ......... H01L 27/3216 |
| JP | 2021-018432 A | | 2/2021 | |

* cited by examiner

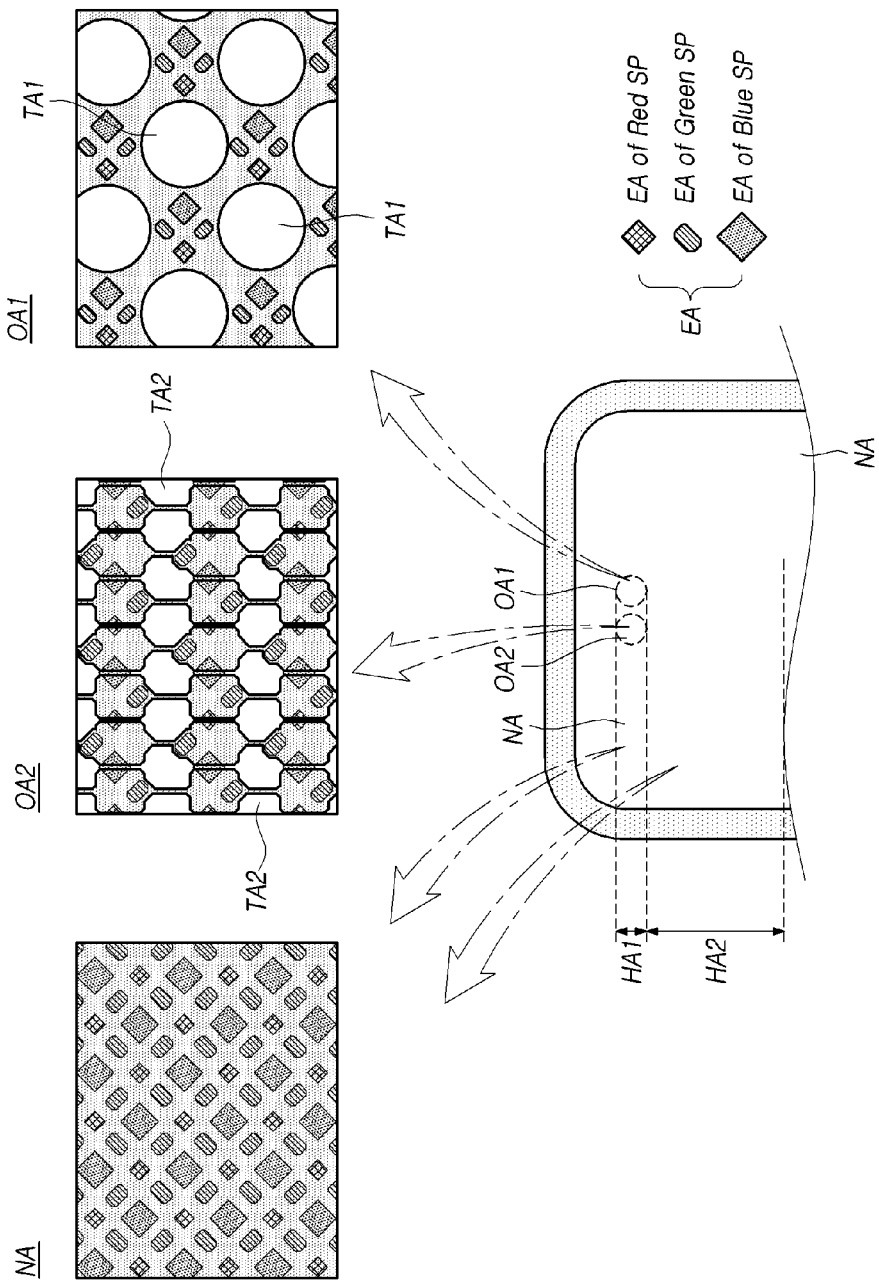

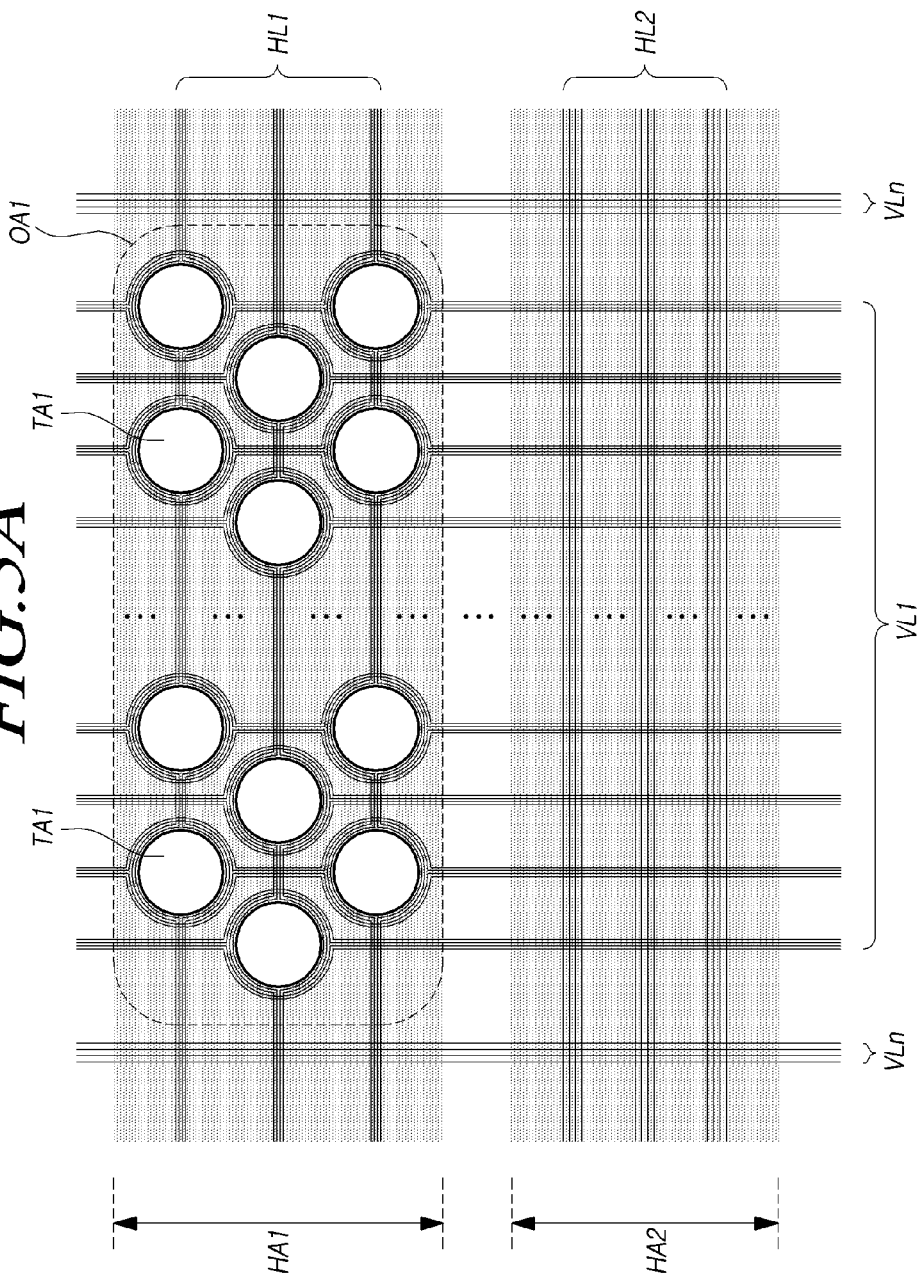

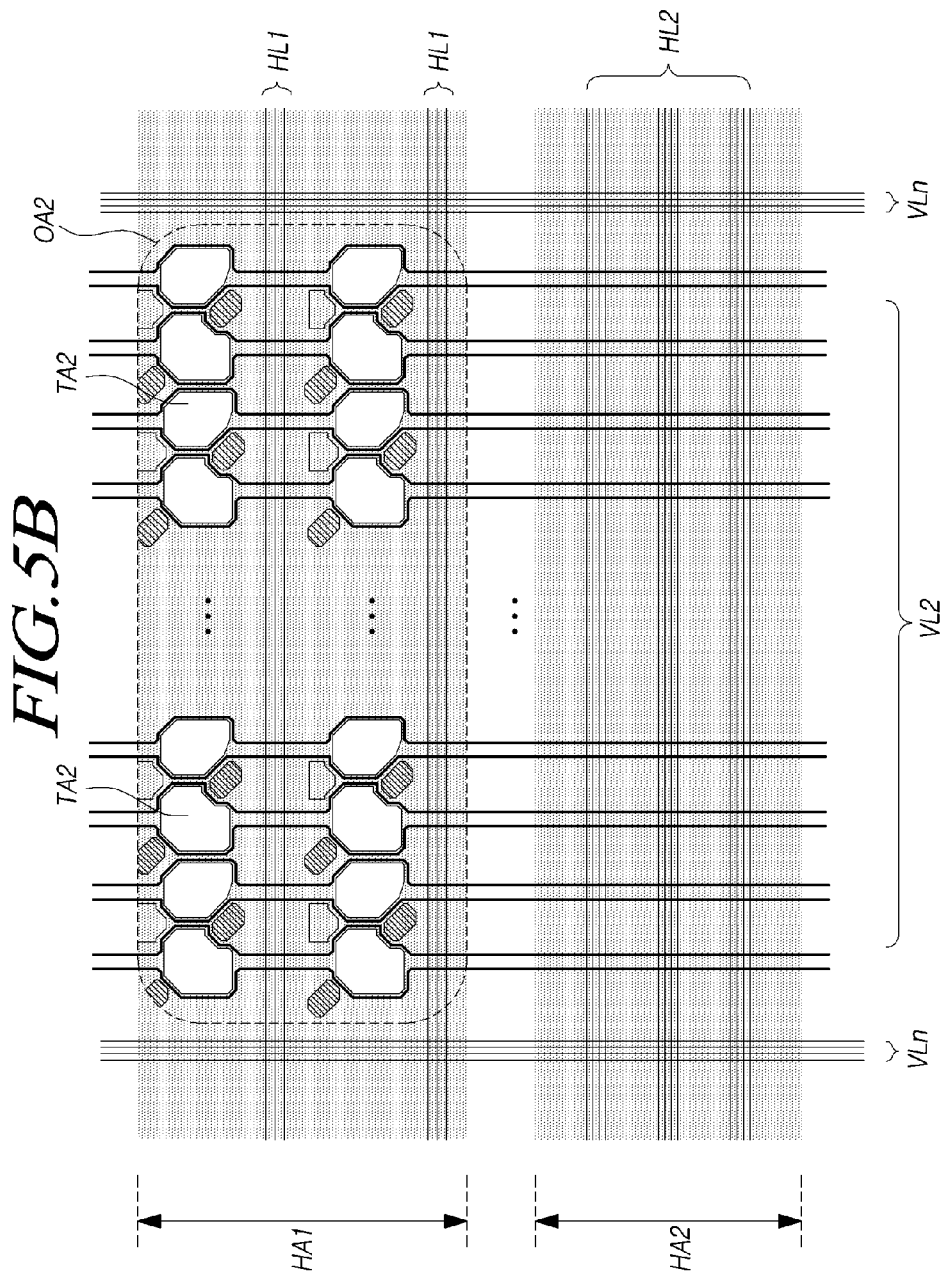

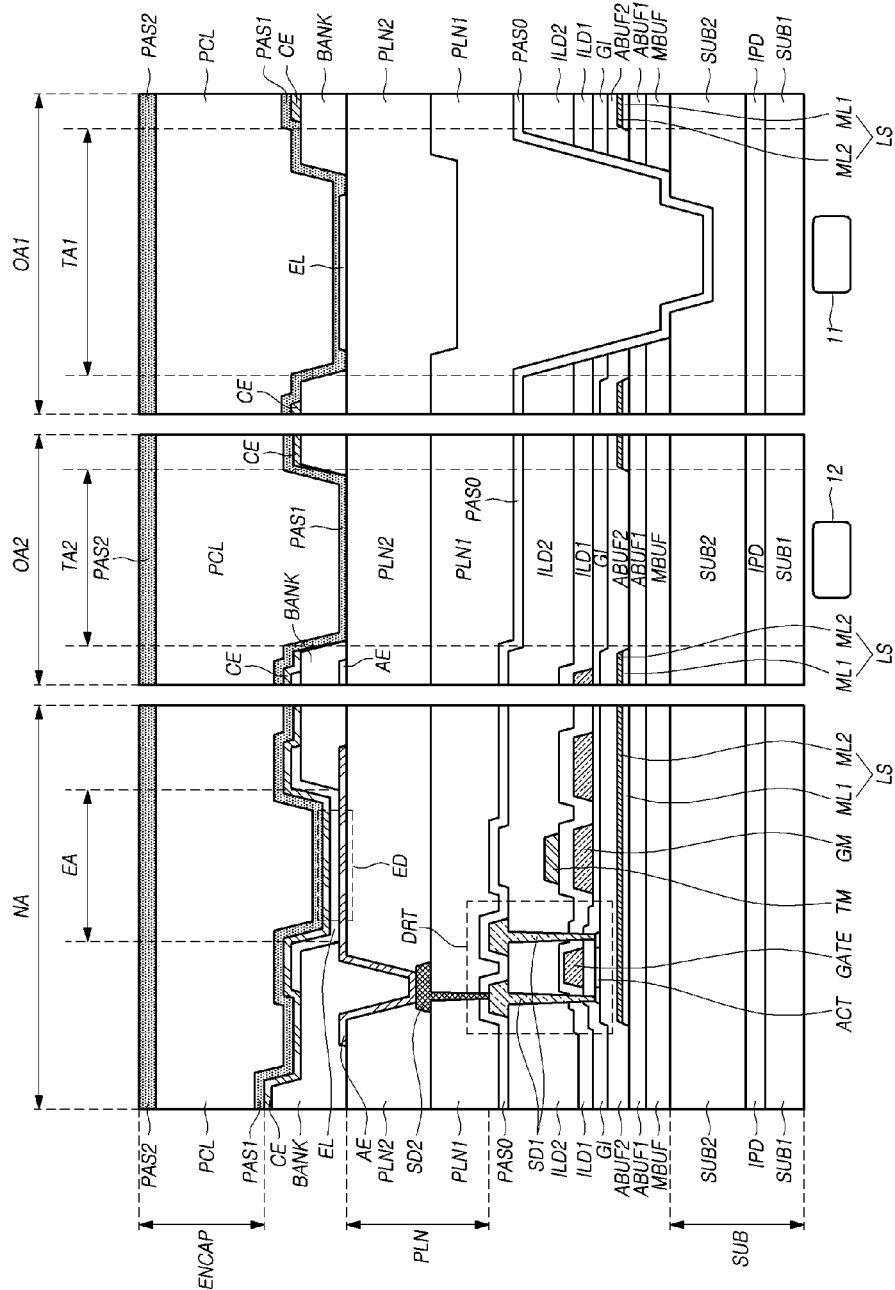

Abnormal Blue SP (shown in the form of dark spots)

EA {
◇ EA of Red SP
⬠ EA of Green SP
◇ EA of Blue SP
}

DISPLAY DEVICE AND DISPLAY PANEL INCLUDING TWO OR MORE SUBPIXELS DISPOSED IN THE NON-TRANSMISSION AREA OF THE OPTICAL AREA AND DISPLAY PANEL HAVING THE SAME

CROSS-REFERENCE TO RELATED APPLICATION

This application claims the priority benefit of Republic of Korea Patent Application No. 10-2021-0158661, filed on Nov. 17, 2021 in the Korean Intellectual Property Office, which is hereby incorporated by reference in its entirety.

BACKGROUND

Technical Field

The present disclosure relates to electronic devices, and more specifically, to a display device and a display panel.

Description of the Related Art

As display technology advances, display devices can provide increased functions, such as an image capture function, a sensing function, and the like, as well as an image display function. To provide these functions, a display device may need to include an optical electronic device, such as a camera, a sensor for detecting an image, and the like.

In order to receive light passing through a front surface of a display device, it may be desirable for an optical electronic device to be located in an area of the display device where incident light coming from the front surface can be advantageously received or detected. Thus, in such a display device, an optical electronic device may be located in a front portion of the display device to allow the optical electronic device to be effectively exposed to incident light. In order to install the optical electronic device in such an implementation, an increased bezel of the display device may be designed, or a notch or a hole may be formed in a display area of a display panel of the display device.

Therefore, as a display device requires an optical electronic device to receive or detect incident light, and perform an intended function, a size of the bezel in the front portion of the display device may be increased, or a substantial disadvantage may be encountered in designing the front portion of the display device.

SUMMARY

Techniques are developed for providing or placing one or more optical electronic devices in a display device without reducing an area of a display area of a display panel of the display device. A display panel and a display device that have a light transmission structure in which even when an optical electronic device is located under a display area of the display panel is disclosed. Thus, the optical electronic device is not exposed in the front surface of the display device and can normally and properly receive or detect light.

In a display device in which an optical electronic device is disposed, an optical area overlapping the optical electronic device is an area needed to have high transmission performance and excellent display performance. To satisfy these requirements, a technology for removing a cathode electrode from one or more transmission areas in order for a display panel to have high transmission performance has been developed. However, one or more other components disposed in a non-transmission area inside of the optical area are damaged by a laser used during a cathode patterning process of removing the cathode electrode from the transmission areas. In order to prevent or at least reduce the components disposed in the non-transmission area of the optical area from being damaged, a technology of disposing a lower shield metal under the components disposed in the non-transmission area of the optical area has been developed, and thereby, recognized that the damage of the components disposed in the non-transmission area of the optical area is prevented or at least reduced. In turn, the displaying of an abnormal image is caused by the lower shield metal disposed under the components disposed in the non-transmission area of the optical area.

The lower shield metal causes the characteristic of a specific transistor located on or over the lower shield metal to vary, and in turn, such a variance in the characteristic of the specific transistor causes such an abnormal image to be displayed. To address these issues, a display device and a display panel that include a lower shield metal having an open structure capable of preventing or at least reducing an abnormal image from being displayed while increasing transmittance of an optical area is disclosed.

In one embodiment, a display device comprises: a display panel comprising a display area that is configured to display an image and a non-display area, the display area comprising an optical area and a normal area located outside of the optical area, wherein the optical area includes a first plurality of light emitting areas, a plurality of transmission areas, and a non-transmission area between adjacent transmission areas from the plurality of transmission areas, and the normal area including a second plurality of light emitting areas; two or more subpixels disposed in the non-transmission area of the optical area, each of the two or more subpixels including a light emitting element, two or more transistors, and a storage capacitor; and a lower shield metal in the non-transmission area of the optical area, the lower shield metal comprising at least one opening that overlaps all or at least a portion of a specific transistor among the two or more transistors included in each of the two or more subpixels.

In one embodiment, a display panel comprises: a substrate comprising a display area that is configured to display an image and a non-display area, the display area including an optical area and a normal area located outside of the optical area, and a non-display area; a lower shield metal over the substrate; a buffer layer on the lower shield metal; and a transistor layer on the buffer layer, wherein the optical area comprises a plurality of light emitting areas and a plurality of transmission areas, at least a portion of the optical area overlapping an optical electronic device located under the substrate, wherein two or more subpixels are disposed in a non-transmission area between adjacent transmission areas in the optical area, each of the two or more subpixels comprises a light emitting element, two or more transistors, and a storage capacitor, and wherein the lower shield metal is in the non-transmission area and comprises at least one opening that overlaps all or at least a portion of a specific transistor among the two or more transistors included in each of the two or more subpixels.

In on embodiment, a display device comprises: a substrate comprising a display area that is configured to display an image and a non-display area that does not display the image; a subpixel included in the display area, the subpixel including a plurality of transistors and a light emitting element; and a lower shield metal in the display area, the lower shield metal overlapping the light emitting element and a first transistor from the plurality of transistors, wherein the lower shield metal includes an opening that overlaps a second transistor from the plurality of transistors but is non-overlapping with the light emitting element and the first transistor.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIG. 4 illustrates example arrangements of subpixels in three areas included in a display area of the display panel according to an embodiment of the present disclosure;

FIG. 5A illustrates example arrangements of signal lines in each of a first optical area and a normal area in the display panel according to an embodiment of the present disclosure;

FIG. 5B illustrates example arrangements of signal lines in each of a second optical area and the normal area in the display panel according to an embodiment of the present disclosure;

FIGS. 6 and 7 are example cross-sectional views of the normal area, the first optical area, and the second optical area included in the display area of the display panel according to embodiments of the present disclosure;

DETAILED DESCRIPTION

Figure 1A:
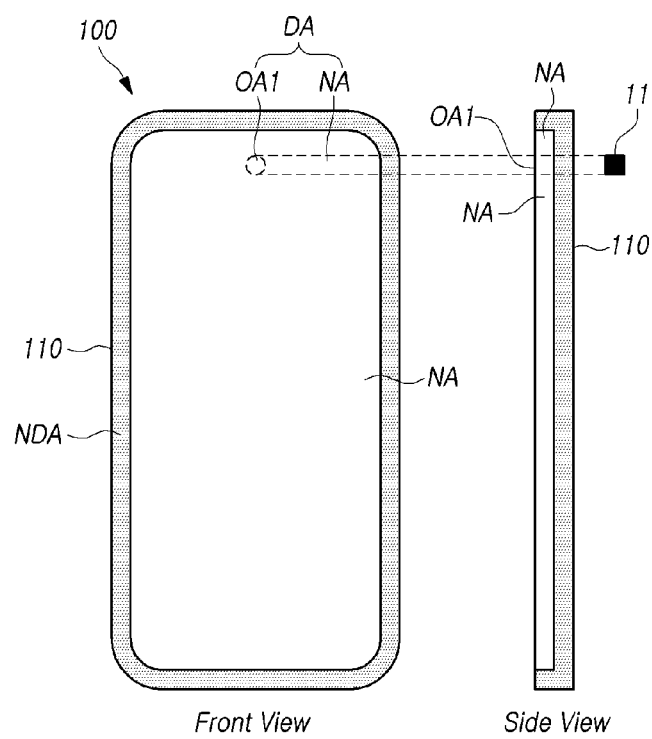
FIGS. 1A, 1B and 1C are plan views illustrating an example display device according to embodiments of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference. In describing a temporal relationship, when the temporal order is described as, for example, "after," "subsequent," "next," or "before," a case which is not continuous may be included unless a more limiting term, such as "just," "immediate(ly)," or "direct(ly)," is used.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference. In describing a temporal relationship, when the temporal order is described as, for example, "after," "subsequent," "next," or "before," a case which is not continuous may be included unless a more limiting term, such as "just," "immediate(ly)," or "direct(ly)," is used. In construing an element, the element is to be construed as including an error or tolerance range even where no explicit description of such an error or tolerance range is provided. Further, the term "may" fully encompasses all the meanings of the term "can." The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element. The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C. Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Figure 1B:
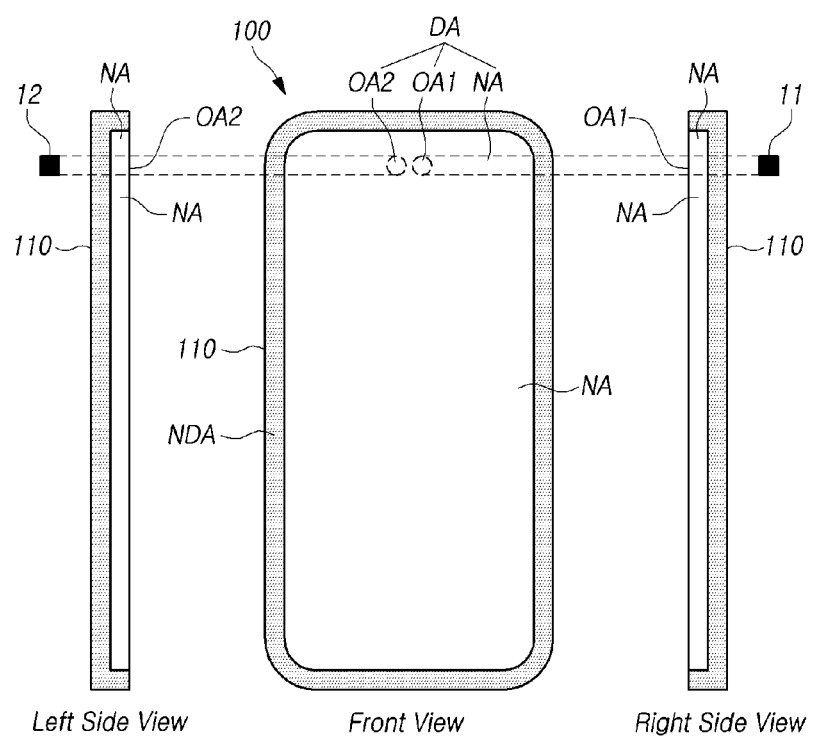
Figure 1C:
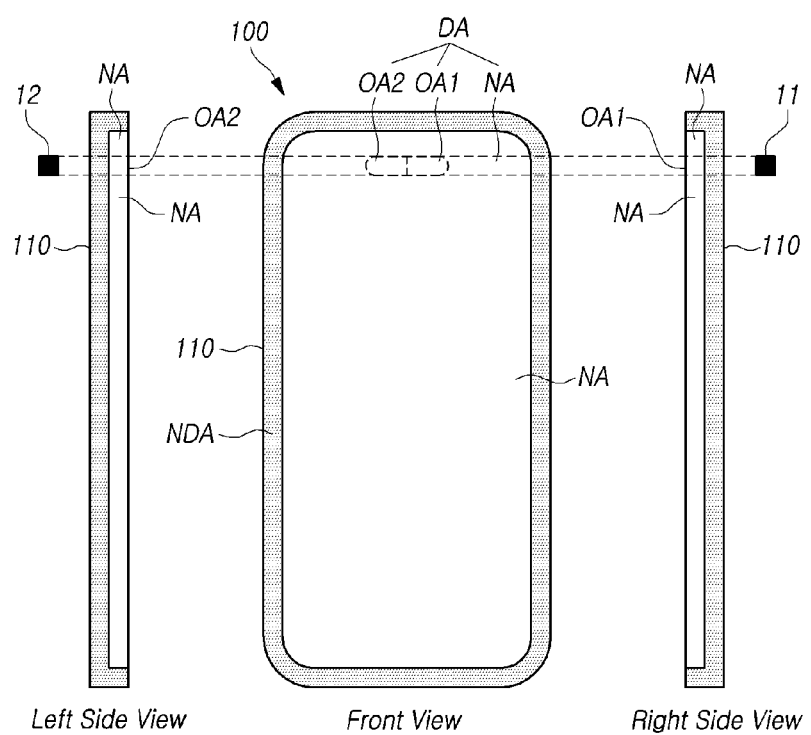

FIGS. 1A, 1B and 1C are plan views illustrating an example display device 100 according to an embodiment of the present disclosure.

Referring to FIGS. 1A, 1B, and 1C, a display device according to aspects of the present disclosure may include a display panel 110 for displaying an image, and one or more optical electronic devices (11, 12). Herein, an optical electronic device may be referred to as a light detector, a light receiver, or a light sensing device. An optical electronic device may include one or more of a camera, a camera lens, a sensor, a sensor for detecting images, or the like.

The display panel 110 may include a display area DA in which an image is displayed and a non-display area NDA in which an image is not displayed.

A plurality of subpixels may be arranged in the display area DA, and several types of signal lines for driving the plurality of subpixels may be arranged therein.

The non-display area NDA may refer to an area outside of the display area DA. Several types of signal lines may be arranged in the non-display area NDA, and several types of driving circuits can be connected thereto. At least a portion of the non-display area NDA may be bent to be invisible from the front of the display panel or may be covered by a case (not shown) of the display panel 110 or the display device 100. The non-display area NDA may be also referred to as a bezel or a bezel area.

Referring to FIGS. 1A, 1B, and 1C, in the display device 100 according to aspects of the present disclosure, one or more optical electronic devices (11, 12) may be located under, or in a lower portion of, the display panel 110 (an opposite side of a viewing surface thereof).

Light can enter the front surface (viewing surface) of the display panel 110, pass through the display panel 110, reach one or more optical electronic devices (11, 12) located under, or in the lower portion of, the display panel 110 (the opposite side of the viewing surface).

The one or more optical electronic devices (11, 12) can receive or detect light transmitting through the display panel 110 and perform a predefined function based on the received light. For example, the one or more optical electronic devices (11, 12) may include one or more of an image capture device such as a camera (an image sensor), and/or the like, and a sensor such as a proximity sensor, an illuminance sensor, and/or the like.

Referring to FIGS. 1A, 1B, and 1C, in the display panel 110 according to aspects of the present disclosure, the display area DA may include one or more optical areas (OA1, OA2) and a normal area NA. Herein, the term "normal area" NA is an area that while being present in the display area DA, does not overlap with one or more optical electronic devices (11, 12) and may also be referred to as a non-optical area.

Referring to FIGS. 1A, 1B, and 1C, the one or more optical areas (OA1, OA2) may be one or more areas overlapping the one or more optical electronic devices (11, 12).

According to an example of FIG. 1A, the display area DA may include a first optical area OA1 and a normal area NA. In this example, at least a portion of the first optical area OA1 may overlap a first optical electronic device 11.

According to an example of FIG. 1B, the display area DA may include a first optical area OA1, a second optical area OA2, and a normal area NA. In the example of FIG. 1B, at least a portion of the normal area NA may be present between the first optical area OA1 and the second optical area OA2. In this example, at least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In the example of FIG. 1C, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In some embodiments, an image display structure and a light transmission structure are desirable to be formed in the one or more optical areas (OA1, OA2). For example, since the one or more optical areas (OA1, OA2) are a portion of the display area DA, therefore, subpixels for displaying an image are needed to be disposed in the one or more optical areas (OA1, OA2). Further, to enable light to transmit the one or more optical electronic devices (11, 12), a light transmission structure is needed, and thus is formed in the one or more optical areas (OA1, OA2).

Even though the one or more optical electronic devices (11, 12) are needed to receive or detect light, the one or more optical electronic devices (11, 12) may be located on the back of the display panel 110 (e.g., on an opposite side of a viewing surface). In this embodiment, the one or more optical electronic devices (11, 12) are located, for example, under, or in a lower portion of, the display panel 110, and is configured to receive light that has transmitted the display panel 110.

For example, the one or more optical electronic devices (11, 12) are not exposed in the front surface (viewing surface) of the display panel 110. Accordingly, when a user faces the front surface of the display device 110, the one or more optical electronic devices (11, 12) are invisible to the user.

In one embodiment, the first optical electronic device 11 may be a camera, and the second optical electronic device 12 may be a sensor such as a proximity sensor, an illuminance sensor, an infrared sensor, and/or the like. For example, the camera may be a camera lens, an image sensor, or a unit including at least one of the camera lens and the image sensor. The sensor may be, for example, an infrared sensor capable of detecting infrared rays.

In another embodiment, the first optical electronic device 11 may be a sensor, and the second optical electronic device 12 may be a camera.

Hereinafter, simply for convenience, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera may be a camera lens, an image sensor, or a unit including at least one of the camera lens and the image sensor.

In the example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1, OA2) included in the display area DA in each of FIGS. 1A, 1B, and 1C are areas where images can be displayed, the normal area NA is an area that lacks a light transmission structure, but the one or more optical areas (OA1, OA2) are areas that include the light transmission structure. Thus, in some embodiments, the normal area NA is an area where a light transmission structure is not implemented or included, and the one or more optical areas (OA1, OA2) are areas in which the light transmission structure is implemented or included.

Accordingly, the one or more optical areas (OA1, OA2) may have a transmittance greater than or equal to a predetermined level, (e.g., a relatively high transmittance), and the normal area NA may not have light transmittance or have a transmittance less than the predetermined level (e.g., a relatively low transmittance).

For example, the one or more optical areas (OA1, OA2) may have a resolution, a subpixel arrangement structure, the number of subpixels per unit area, an electrode structure, a line structure, an electrode arrangement structure, a line arrangement structure, or/and the like different from that/those of the normal area NA.

In an embodiment, the number of subpixels per unit area in the one or more optical areas OA1, OA2 may be less than the number of subpixels per unit area in the normal area NA. For example, the resolution of the one or more optical areas (OA1, OA2) may be less than that of the normal area NA. Here, the number of pixels (or subpixels) per unit area can be measured using pixels (or subpixels) per inch (PPI), which represents the number of pixels (or subpixels) within 1 inch, as a unit for measuring resolution.

In an embodiment of each of FIGS. 1A, 1B, and 1C, the number of subpixels per unit area in the first optical areas OA1 may be less than the number of subpixels per unit area in the normal area NA. In an embodiment of each of FIGS. 1A, 1B, and 1C, the number of subpixels per unit area in the second optical areas OA2 may be greater than or equal to the number of subpixels per unit area in the first optical areas OA1, and be less than the number of subpixels per unit area in the normal area NA.

In each of FIGS. 1A, 1B, and 1C, the first optical area OA1 may have various shapes, such as a circle, an ellipse, a quadrangle, a hexagon, an octagon or the like. In each of FIGS. 1B, and 1C, the second optical area OA2 may have various shapes, such as a circle, an ellipse, a quadrangle, a hexagon, an octagon or the like. The first optical area OA1 and the second optical area OA2 may have the same shape or different shapes.

Referring to FIG. 1C, in the example where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like.

Hereinafter, for convenience of description, discussions will be conducted based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

When the display device 100 according to aspects of the present disclosure has a structure in which the first optical electronic device 11 such as a camera, and the like. is located under, or in a lower portion of, the display panel 100 without being exposed to the outside, such a display device 100 according to aspects of the present disclosure may be referred to as a display in which under-display camera (UDC) technology is implemented.

According to this example, in the display device 100 according to aspects of the present disclosure, a reduction of an area or size of the display area DA can be prevented because a notch or a camera hole for exposing a camera need not be formed in the display panel 110.

Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11, 12) are located on the back of (e.g., under, or in a lower portion of) the display panel 110 of the display device 100 (e.g., hidden or not exposed to the outside), in some embodiments, the one or more optical electronic devices (11, 12) can perform normal predefined functionalities, and thus, receive or detect light.

Further, in the display device 100 according to an embodiment of the present disclosure, although one or more optical electronic devices (11, 12) are located on the back of (e.g., under, or in a lower portion of) the display panel 110 to be hidden and located to be overlap the display area DA, it is necessary for image display to be normally performed in the one or more optical areas (OA1, OA2) overlapping the one or more optical electronic devices (11, 12) in the area DA. Thus, in one or more examples, even though one or more optical electronic devices 11 and 12 are located on the back of the display panel, images can be displayed in a normal manner (e.g., without reduction in image quality) in the one or more optical areas OA1 and OA2 overlapping the one or more optical electronic devices 11 and 12 in the area DA.

Figure 2:
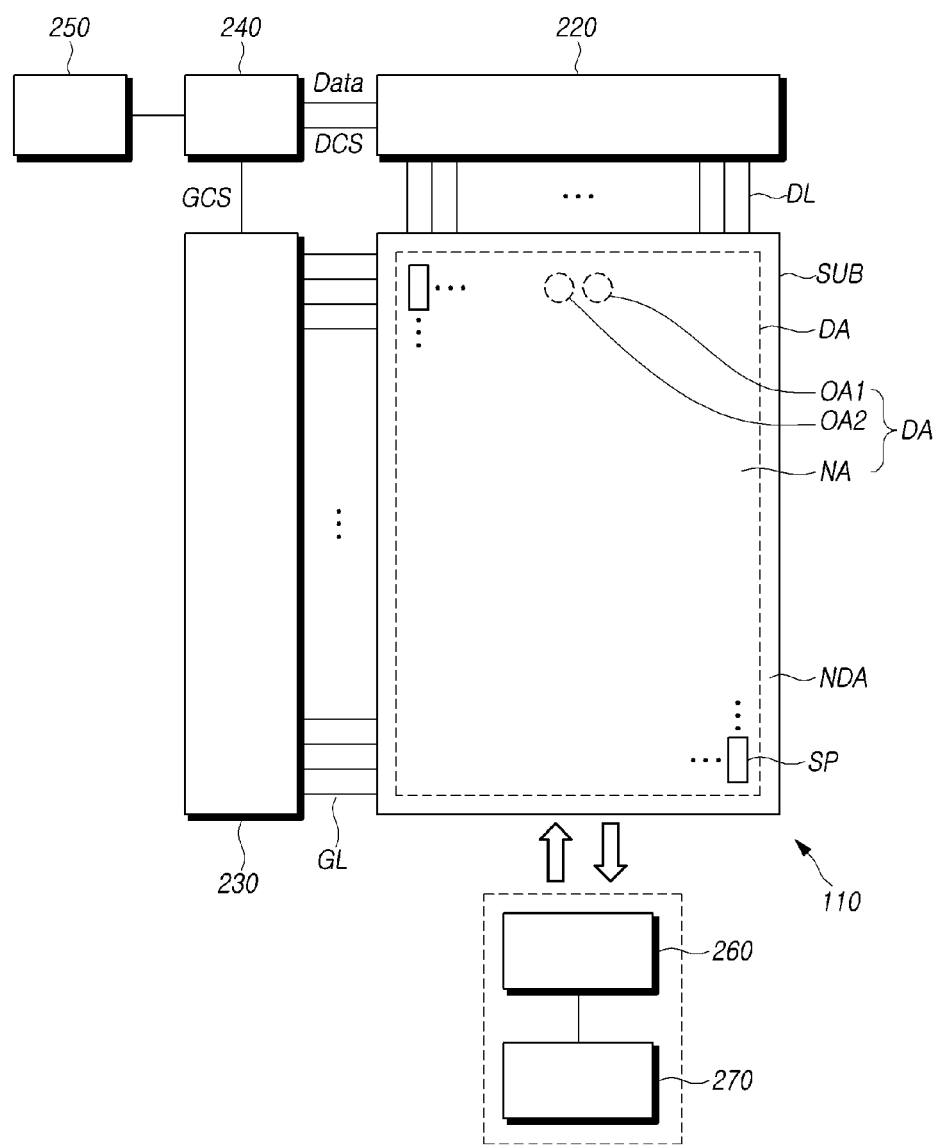
FIG. 2 illustrates an example system configuration of the display device according to an embodiment of the present disclosure.

FIG. 2 illustrates an example system configuration of the display device 100 according to an embodiment of the present disclosure.

Referring to FIG. 2, the display device 100 can include the display panel 110 and a display driving circuit as components for displaying an image.

The display driving circuit is a circuit for driving the display panel 110, and can include a data driving circuit 220, a gate driving circuit 230, a display controller 240, and other components.

The display panel 110 can include a display area DA in which an image is displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 can include a substrate SUB and a plurality of subpixels SP disposed on the substrate SUB. The display panel 110 can further include various types of signal lines to drive the plurality of subpixels SP.

The display device 100 according to aspects of the present disclosure may be a liquid crystal display device, or the like, or a self-emission display device in which light is emitted from the display panel 110 itself. In an example where the display device 100 according to aspects of the present disclosure is the self-emission display device, each of the plurality of subpixels SP may include a light emitting element.

In one embodiment, the display device 100 according to aspects of the present disclosure may be an organic light emitting display device in which the light emitting element is implemented using an organic light emitting diode (OLED). For another embodiment, the display device 100 according to aspects of the present disclosure may be an inorganic light emitting display device in which the light emitting element is implemented using an inorganic material-based light emitting diode. In further another embodiment, the display device 100 according to aspects of the present disclosure may be a quantum dot display device in which the light emitting element is implemented using quantum dots, which are self-emission semiconductor crystals.

The structure of each of the plurality of subpixels SP may vary according to types of the display devices 100. For example, in an example where the display device 100 is a self-emission display device including self-emission subpixels SP, each subpixel SP may include a self-emission light emitting element, one or more transistors, and one or more capacitors.

The various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may intersect each other. Each of the plurality of data lines DL may extend in a first direction. Each of the plurality of gate lines GL may extend in a second direction.

For example, the first direction may be a column or vertical direction, and the second direction may be a row or horizontal direction. In another example, the first direction may be the row direction, and the second direction may be the column direction.

The data driving circuit 220 is a circuit for driving the plurality of data lines DL, and can supply data signals to the plurality of data lines DL. The gate driving circuit 230 is a circuit for driving the plurality of gate lines GL, and can supply gate signals to the plurality of gate lines GL.

The display controller 240 may be a device for controlling the data driving circuit 220 and the gate driving circuit 230, and can control driving timing for the plurality of data lines DL and driving timing for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can supply data signals to the plurality of data lines DL according to the driving timing control of the display controller 240.

The data driving circuit 220 can receive the digital image data Data from the display controller 240, convert the received image data Data into analog data signals, and supply the resulting analog data signals to the plurality of data lines DL.

The gate driving circuit 230 can supply gate signals to the plurality of gate lines GL according to the timing control of the display controller 240. The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. The gate driving circuit 230 may be connected to the substrate in the case of the chip on glass (COG) type, the chip on film (COF) type, or the like.

In some embodiments, at least one of the data driving circuit 220 and the gate driving circuit 230 may be disposed in the display area DA of the display panel 110. For example, at least one of the data driving circuit 220 and the gate driving circuit 230 may be disposed not to overlap subpixels SP, or disposed to be overlapped with one or more, or all, of the subpixels SP.

The data driving circuit 220 may also be located on, but not limited to, only one side or portion (e.g., an upper edge or a lower edge) of the display panel 110. In some embodiments, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in only one side or portion (e.g., a left edge or a right edge) of the display panel 110. In some embodiments, the gate driving circuit 230 may be connected to two sides or portions (e.g., a left edge and a right edge) of the panel 110, or be connected to at least two of four sides or portions (e.g., an upper edge, a lower edge, the left edge, and the right edge) of the panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of performing other control functions in addition to the function of the typical timing controller. In some embodiments, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the gate driving circuit 220 and the data driving circuit 230 through the printed circuit board, flexible printed circuit, and/or the like.

The display controller 240 may transmit signals to, and receive signals from, the data driving circuit 220 via one or more predefined interfaces. In some embodiments, such interfaces may include a low voltage differential signaling (LVDS) interface, an embedded clock point-point (EPI) interface, a serial peripheral interface (SPI), and the like.

In order to further provide a touch sensing function, as well as an image display function, the display device 100 according to aspects of the present disclosure may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit can include a touch driving circuit 260 capable of generating and providing touch sensing data by driving and sensing the touch sensor, a touch controller 270 capable of detecting the occurrence of a touch event or detecting a touch position using the touch sensing data, and one or more other components.

The touch sensor can include a plurality of touch electrodes. The touch sensor can further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where the add-on type of touch sensor is disposed, the touch panel and the display panel 110 may be separately manufactured and coupled during an assembly process. The add-on type of touch panel may include a touch panel substrate and a plurality of touch electrodes on the touch panel substrate.

In the example where the touch sensor is implemented inside of the display panel 110, a process of manufacturing the display panel 110 may include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing method or a mutual-capacitance sensing method.

In the example where the touch sensing circuit performs touch sensing in the self-capacitance sensing method, the touch sensing circuit can perform touch sensing based on capacitance between each touch electrode and a touch object (e.g., a finger, a pen, and the like).

According to the self-capacitance sensing method, each of the plurality of touch electrodes can serve as both a driving touch electrode and a sensing touch electrode. The touch driving circuit 260 can drive all, or one or more, of the plurality of touch electrodes and sense al, or one or more, of the plurality of touch electrodes.

In the example where the touch sensing circuit performs touch sensing in the mutual-capacitance sensing method, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

The display device 100 according to aspects of the present disclosure may be a mobile terminal such as a smart phone, a tablet, or the like, or a monitor, a television (TV), or the like. Such devices may be of various types, sizes, and shapes. The display device 100 according to embodiments of the present disclosure are not limited thereto, and includes displays of various types, sizes, and shapes for displaying information or images.

As described above, the display area DA of the display panel 110 may include a normal area NA and one or more optical areas (OA1, OA2), for example, as shown in FIGS. 1A, 1B, and 1C.

The normal area NA and the one or more optical areas (OA1, OA2) are areas where an image can be displayed. However, the normal NA is an area in which a light transmission structure is not included, and the one or more optical areas (OA1, OA2) are areas in which the light transmission structure is included.

As discussed above with respect to the examples of FIGS. 1A, 1B, and 1C, although the display area DA of the display panel 110 may include the one or more optical areas (OA1, OA2) in addition to the normal area NA, for convenience of description, in the discussion that follows, it is assumed that the display area DA includes first and second optical areas (OA1, OA2) and the normal area NA; and the normal area NA thereof includes the normal areas NAs in FIGS. 1A to 1C, and the first and second optical areas (OA1, OA2) thereof include the first optical areas OA1s in FIGS. 1A, 1B, and 1C and the second optical areas OA2s of FIGS. 1B and 1C, respectively, unless explicitly stated otherwise.

Figure 3:
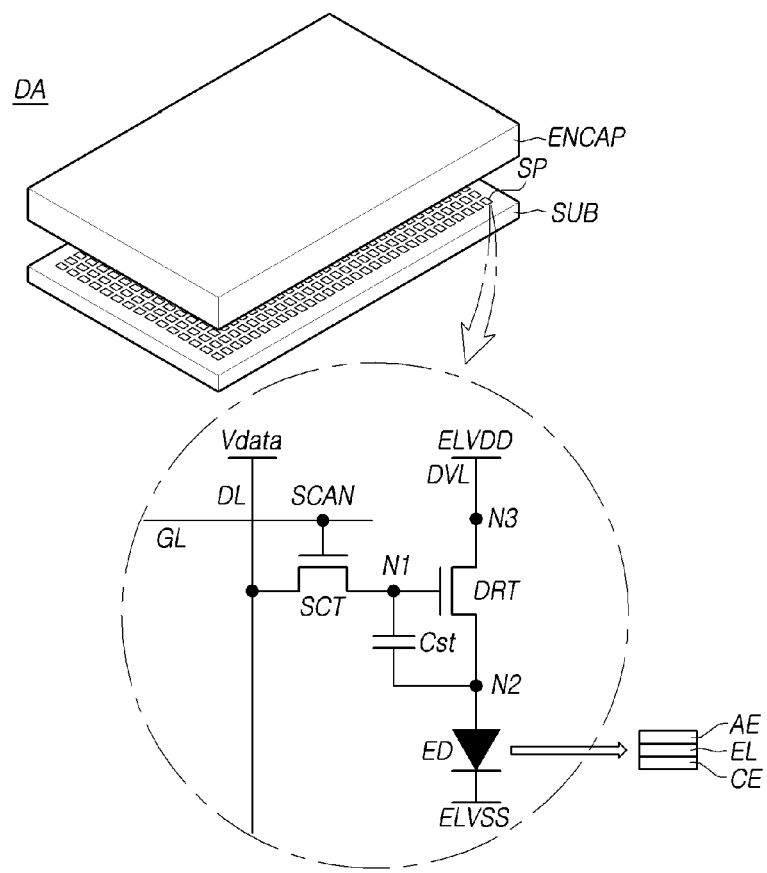
FIG. 3 illustrates an example equivalent circuit of a subpixel in a display panel according to an embodiment of the present disclosure.

FIG. 3 illustrates an example equivalent circuit of a subpixel SP in the display panel 110 according to an embodiment of the present disclosure.

Each of subpixels SP disposed in the normal area NA, the first optical area OA1, and the second optical area OA2 included in the display area DA of the display panel 110 may include a light emitting element ED, a driving transistor DRT for driving the light emitting element ED, a scan transistor SCT for transmitting a data voltage Vdata to a first node Nx of the driving transistor DRT, a storage capacitor Cst for maintaining a voltage at an approximate constant level during one frame, and the like.

The driving transistor DRT can include the first node Nx to which a data voltage is applied, a second node Ny electrically connected to the light emitting element ED, and a third node Nz to which a driving voltage ELVDD through a driving voltage line DVL is applied. In the driving transistor DRT, the first node Nx may be a gate node, the second node Ny may be a source node or a drain node, and the third node Nz may be the drain node or the source node.

The light emitting element ED can include an anode electrode AE, an emission layer EL, and a cathode electrode CE. The anode electrode AE may be a pixel electrode disposed in each subpixel SP, and may be electrically connected to the second node Ny of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in the discussion that follows, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In an example where the organic light emitting diode is used as the light emitting element ED, the emission layer EL thereof may include an organic emission layer including an organic material.

The scan transistor SCT may be turned on and off by a scan signal SCAN that is a gate signal applied through a gate line GL, and be electrically connected between the first node Nx of the driving transistor DRT and a data line DL.

The storage capacitor Cst may be electrically connected between the first node Nx and the second node Ny of the driving transistor DRT.

Each subpixel SP may include two transistors (2T: DRT and SCT) and one capacitor (1C: Cst) (which may be referred to as a "2T1C structure") as shown in FIG. 3, and in some cases, may further include one or more transistors, or further include one or more capacitors.

In some embodiments, the storage capacitor Cst, which may be present between the first node Nx and the second node Ny of the driving transistor DRT, may be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT may be an n-type transistor or a p-type transistor.

Since circuit elements (e.g., in particular, a light emitting element ED) in each subpixel SP are vulnerable to external moisture or oxygen, an encapsulation layer ENCAP may be disposed in the display panel 110 in order to prevent the external moisture or oxygen from penetrating into the circuit elements (e.g., in particular, the light emitting element ED). The encapsulation layer ENCAP may be disposed to cover the light emitting element ED.

FIG. 4 illustrates example arrangements of subpixels SP in the three areas (NA, OA1, and OA2) included in the display area DA of the display panel 110 according to an embodiment of the present disclosure.

Referring to FIG. 4, in some embodiments, a plurality of subpixels SP may be disposed in each of the normal area NA, the first optical area OA1, and the second optical area OA2 included in the display area DA.

The plurality of subpixels SP may include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 may include one or more light emitting areas EA of one or more red subpixels (Red SP), and one or more light emitting areas EA of one or more green subpixels (Green SP), and one or more light emitting areas EA of one or more blue subpixels (Blue SP).

Referring to FIG. 4, in some embodiments, the normal area NA may not include a light transmission structure, but may include light emitting areas EA.

However, in some embodiments, the first optical area OA1 and the second optical area OA2 include both the light emitting areas EA and the light transmission structure.

Accordingly, the first optical area OA1 can include light emitting areas EA and first transmission areas TA1 (e.g., light transmission areas), and the second optical area OA2 can include the light emitting areas EA and second transmission area TA2 (e.g., light transmission areas).

The light emitting areas EA and the transmission areas (TA1, TA2) may be distinct according to whether the transmission of light is allowed. For example, the light emitting areas EA may be areas not allowing light to transmit (e.g., not allowing light to transmit to the back of the display panel), and the transmission areas (TA1, TA2) may be areas allowing light to transmit (e.g., allowing light to transmit to the back of the display panel).

The light emitting areas EA and the transmission areas (TA1, TA2) may be also distinct according to whether or not a specific metal layer is included. For example, the cathode electrode CE as shown in FIG. 3 may be disposed in the light emitting areas EA, and the cathode electrode CE may not be disposed in the transmission areas (TA1, TA2). In some embodiments, a light shield layer may be disposed in the light emitting areas EA, and a light shield layer may not be disposed in the transmission areas (TA1, TA2).

Since the first optical area OA1 includes the first transmission areas TA1 and the second optical area OA2 includes the second transmission areas TA2, both of the first optical area OA1 and the second optical area OA2 are areas through which light can pass.

In one embodiment, a transmittance (a degree of transmission) of the first optical area OA1 and a transmittance (a degree of transmission) of the second optical area OA2 may be substantially equal.

For example, the first transmission area TA1 of the first optical area OA1 and the second transmission area TA2 of the second optical area OA2 may have a substantially equal shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 may be substantially equal. In an example, each of the first transmission areas TA1s has the same shape and size. In an example, each of the second transmission areas TA2s has the same shape and size.

In another embodiment, a transmittance (a degree of transmission) of the first optical area OA1 and a transmittance (a degree of transmission) of the second optical area OA2 may be different.

For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have a substantially equal shape or size, a ratio of the first transmission area TA1 to the first optical area OA1 and a ratio of the second transmission area TA2 to the second optical area OA2 may be different from each other.

For example, in the example where the first optical electronic device 11, as shown in FIGS. 1A, 1B and 1C, overlapping the first optical area OA1 is a camera, and the second optical electronic device 12, as shown in FIGS. 1B and 1C, overlapping the first optical area OA1 is a camera, overlapping the second optical area OA2 is a sensor for detecting images, the camera may need a greater amount of light than the sensor.

Thus, the transmittance (degree of transmission) of the first optical area OA1 may be greater than the transmittance (degree of transmission) of the second optical area OA2.

For example, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have a substantially equal size, a ratio of the first transmission area TA1 to the first optical area OA1 may be greater than a ratio of the second transmission area TA2 to the second optical area OA2.

For convenience of description, the discussion that follows is provided based on the embodiment in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency.

Further, in the discussion that follows, it is assumed that the first optical areas OA1 and the second optical areas OA2 are located in an upper edge of the display area DA of the display panel 110, and are disposed to be horizontally adjacent to each other such as being disposed in a direction in which the upper edge extends, as shown in FIG. 4, unless explicitly stated otherwise.

Referring to FIG. 4, a horizontal display area in which the first optical area OA1 and the second optical area OA2 are disposed is referred to as a first horizontal display area HA1, and another horizontal display area in which the first optical area OA1 and the second optical area OA2 are not disposed is referred to as a second horizontal display area HA2.

Referring to FIG. 4, the first horizontal display area HA1 may include a portion of the normal area NA, the first optical area OA1, and the second optical area OA2. The second horizontal display area HA2 may include another portion of the normal area NA that lacks the first optical area OA1 and the second optical area OA2.

FIG. 5A illustrates example arrangements of signal lines in each of the first optical area OA1 and the normal area NA of the display panel 110 according to an embodiment of the present disclosure, and FIG. 5B illustrates example arrangements of signal lines in each of the second optical area OA2 and the normal area NA of the display panel 110 according to an embodiment of the present disclosure.

First horizontal display areas HA1 shown in FIGS. 5A and 5B are portions of the first horizontal display area HA1 of the display panel 110, and second horizontal display areas HA2 therein are portions of the second horizontal display area HA2 of the display panel 110.

A first optical area OA1 shown in FIG. 5A is a portion of the first optical area OA1 of the display panel 110, and a second optical area OA2 shown in FIG. 5B is a portion of the second optical area OA2 of the display panel 110.

Referring to FIGS. 5A and 5B, the first horizontal display area HA1 may include a portion of the normal area NA, the first optical area OA1, and the second optical area OA2. The second horizontal display area HA2 may include another portion of the normal area NA that lacks the first optical area OA1 and the second optical area OA2.

Various types of horizontal lines (HL1, HL2) and various types of vertical lines (VLn, VL1, VL2) may be disposed in the display panel 11.

In some embodiments, the term "horizontal" and the term "vertical" are used to refer to two directions intersecting the display panel. However, it should be noted that the horizontal direction and the vertical direction may be changed depending on a viewing direction. The horizontal direction may refer to, for example, a direction in which one gate line GL is disposed to extend and, and the vertical direction may refer to, for example, a direction in which one data line DL is disposed to extend. As such, the term horizontal and the term vertical are used to represent two directions.

Referring to FIGS. 5A and 5B, the horizontal lines disposed in the display panel 110 may include first horizontal lines HL1 disposed in the first horizontal display area HA1 and second horizontal lines HL2 disposed on the second horizontal display area HA2.

The horizontal lines disposed in the display panel 110 may be gate lines GL. That is, the first horizontal lines HL1 and the second horizontal lines HL2 may be the gate lines GL. The gate lines GL may include various types of gate lines according to structures of one or more subpixels SP.

Referring to FIGS. 5A and 5B, the vertical lines disposed in the display panel 110 may include typical vertical lines VLn disposed only in the normal area NA, first vertical lines VL1 running through both of the first optical area OA1 and the normal area NA, second vertical lines VL2 running through both of the second optical area OA2 and the normal area NA.

The vertical lines disposed in the display panel 110 may include data lines DL, driving voltage lines DVL, and the like, and may further include reference voltage lines, initialization voltage lines, and the like. That is, the typical vertical lines VLn, the first vertical lines VL1 and the second vertical lines VL2 may include the data lines DL, the driving voltage lines DVL, and the like, and may further include the reference voltage lines, the initialization voltage lines, and the like.

In some embodiments, it should be noted that the term "horizontal" in the second horizontal line HL2 may mean only that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 may include one or more bent or folded portions that are different from the configurations shown in FIGS. 5A and 5B. Likewise, one or more of the first horizontal lines HL1 may also include one or more bent or folded portions.

In some embodiments, it should be noted that the term "vertical" in the typical vertical line VLn may mean only that a signal is carried from an upper portion, to a lower portion, of the display panel (or from the lower portion to the upper portion), and may not mean that the typical vertical line VLn runs in a straight line only in the direct vertical direction. For example, in FIGS. 5A and 5B, although the typical vertical lines VLn are illustrated in a straight line, one or more of the typical vertical lines VLn may include one or more bent or folded portions that are different from the configurations shown in FIGS. 5A and 5B. Likewise, one or more of the first vertical line VL1 and one or more of the second vertical line VL2 may also include one or more bent or folded portions.

Referring to FIG. 5A, the first optical area OA1 included in the first horizontal area HA1 may include light emitting areas EA, as shown in FIG. 4, and first transmission areas TA1. In the first optical area OA1, respective outer areas of the first transmission areas TA1 may include corresponding light emitting areas EA.

Referring to FIG. 5A, in order to improve the transmittance of the first optical area OA1, the first horizontal lines HL1 may run through the first optical area OA1 while avoiding the first transmission areas TA1 in the first optical area OA1.

Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal area HA1 and the second horizontal lines HL2 disposed in the second horizontal area HA2 may have different shapes or lengths. For example, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run through the first optical area OA1 while avoiding the first transmission areas TA1 in the first optical area OA1.

Accordingly, each of the first vertical lines VL1 running through the first optical area OA1 may include one or more curved or bent portions running around one or more respective outer edges of one or more of the first transmission areas TA1.

Thus, the first vertical lines VL1 running through the first optical area OA1 and the typical vertical lines VLn disposed in the normal area NA without running through the first optical area OA1 may have different shapes or lengths.

Referring to FIG. 5A, the first transmission areas TA1 included in the first optical area OA1 in the first horizontal area HA1 may be arranged in a diagonal direction.

Referring to FIG. 5A, in the first optical area OA1 in the first horizontal area HAL one or more light emitting areas EA may be disposed between two horizontally adjacent first transmission areas TA1. In the first optical area OA1 in the first horizontal area HAL one or more light emitting areas EA may be disposed between two vertically adjacent first transmission areas TA1.

Referring to FIG. 5A, each of the first horizontal lines HL1 disposed in the first horizontal area HA1 (e.g., each of the first horizontal lines HL1 running through the first optical area OA1) may include one or more curved or bent portions running around one or more respective outer edges of one or more of the first transmission areas TA1.

Referring to FIG. 5B, the second optical area OA2 included in the first horizontal area HA1 may include light emitting areas EA and second transmission areas TA2. In the second optical area OA2, respective outer areas of the second transmission areas TA2 may include corresponding light emitting areas EA.

In one embodiment, the light emitting areas EA and the second transmission areas TA2 in the second optical area OA2 may have locations and arrangements substantially equal to the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right or right to left direction). In this example, a light emitting area EA may not be disposed between two second transmission areas TA2 adjacent to each other in the horizontal direction. Further, one or more of the light emitting areas EA in the second optical area OA2 may be disposed between second transmission areas TA2 adjacent to each other in the vertical direction (the top to bottom or bottom to top direction). For example, one or more light emitting areas EA may be disposed between two rows of second transmission areas.

When in the first horizontal area HAL running through the second optical area OA2 and the normal area NA adjacent to the second optical area OA2, in one embodiment, the first horizontal lines HL1 may have substantially the same arrangement as the first horizontal lines HL1 of FIG. 5A.

In another embodiment, as shown in FIG. 5B, when in the first horizontal area HAL running through the second optical area OA2 and the normal area NA adjacent to the second optical area OA2, the first horizontal lines HL1 may have an arrangement different from the first horizontal lines HL1 of FIG. 5A.

This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal area HAL the first horizontal lines HL1 run through the second optical area OA2 and the normal area NA adjacent to the second optical area OA2, the first horizontal lines HL1 may run between vertically adjacent second transmission areas TA2 in a straight line without having a curved or bent portion.

For example, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run through the second optical area OA2 while avoiding the second transmission areas TA2 in the second optical area OA2.

Accordingly, each of the second vertical lines VL2 running through the second optical area OA2 may include one or more curved or bent portions running around one or more respective outer edges of one or more of the second transmission areas TA2.

Thus, the second vertical lines VL2 running through the second optical area OA2 and the typical vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed in the normal area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed in the normal area NA without running through the first optical area OA1 and the second optical area OA2, which is referred to as a second resistance.

Referring to FIGS. 5A and 5B, according to an example light transmitting structure, the first optical area OA1 that at least partially overlaps the first optical electronic device 11 includes the first transmission areas TA1, and the second optical area OA2 that at least partially overlaps with the second optical electronic device 12 includes the second transmission areas TA2. Therefore, the number of subpixels per unit area in each of the first optical area OA1 and the second optical area OA2 may be less that of than the normal area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, may be less than the number of subpixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number may increase.

As described above, since the number (the first number) of subpixels connected to each, or one or more, of the first horizontal lines HL1 running through the first optical area OA1 and the second optical area OA2 is less than the number of subpixels (second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 may be less than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly less than an RC value of the second horizontal lines HL2 disposed only in the normal area NA without running through the first optical area OA1 and the second optical area OA2, which is referred to as a second RC value. Thus, in this example, the first RC value is greatly smaller than the second RC value (i.e., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

Figure 7:
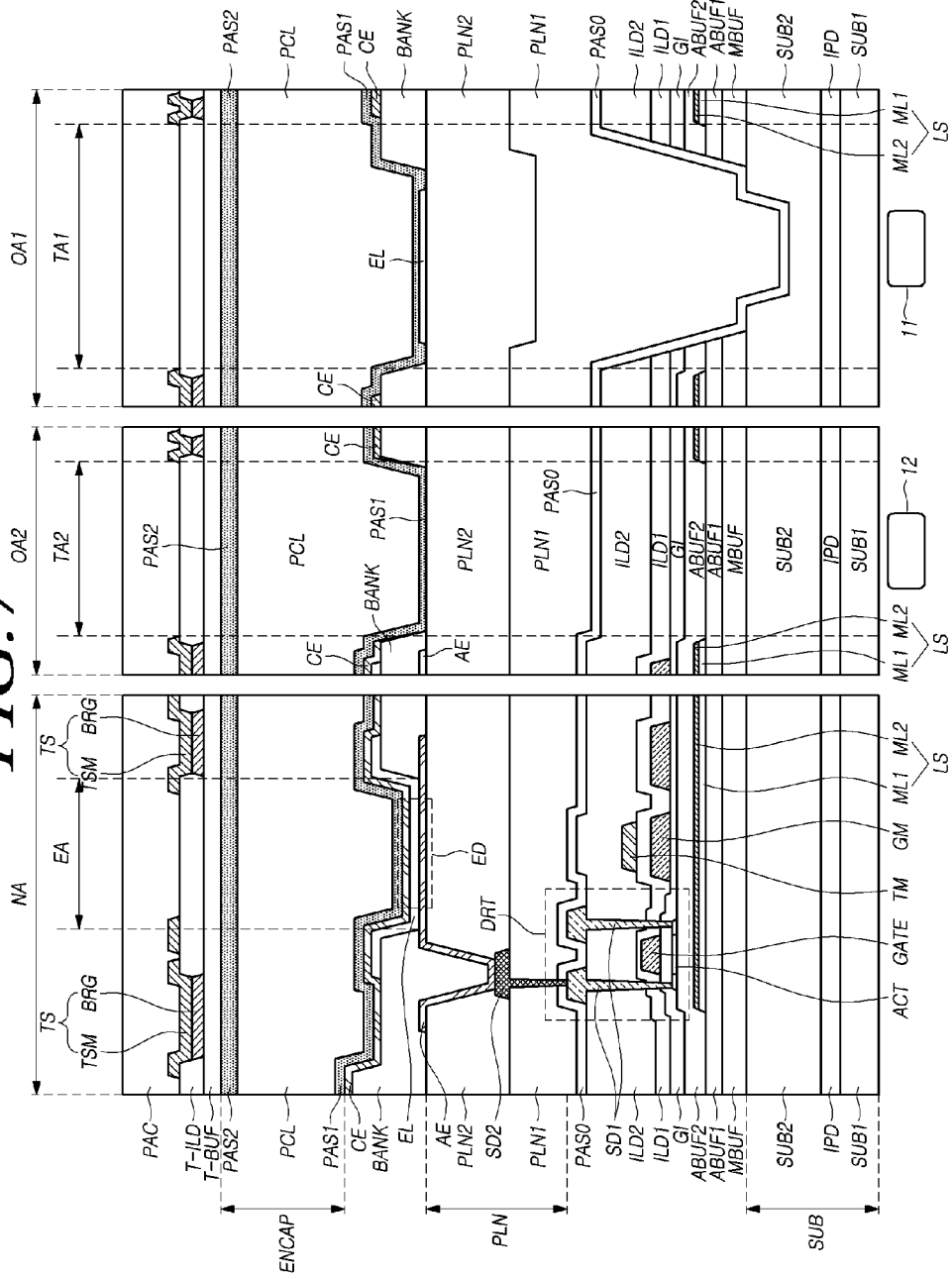

FIGS. 6 and 7 are example cross-sectional views of each of the first optical area OA1, the second optical area OA2, and the normal area NA included in the display area DA of the display panel 110 according to embodiments of the present disclosure.

FIG. 6 shows the display panel 110 in an example where a touch sensor is implemented outside of the display panel 110 in the form of a touch panel, and FIG. 7 shows the display panel 110 in an example where a touch sensor TS is implemented inside of the display panel 110.

Each of FIGS. 6 and 7 shows example cross-sectional views of the normal area NA, the first optical area OA1, and the second optical area OA2 included in the display area DA.

First, a stack structure of the normal area NA will be described with reference to FIGS. 6 and 7. Respective light emitting areas EA included in the first optical area OA1 and the second optical area OA2 may have the same stack structure as the normal area NA or a light emitting area EA in the normal area NA.

Referring to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent or at least reduce the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. An active layer ACT of the driving transistor DRT may be disposed on the second active buffer layer ABUF2.

A gate insulating layer GI may be disposed to cover the active layer ACT.

A gate electrode GATE of the driving transistor DRT may be disposed on the gate insulating layer GI. Further, a gate material layer GM may be disposed on the gate insulating layer GI, together with the gate electrode GATE of the driving transistor DRT, at a location different from the location where the driving transistor DRT is disposed.

A first interlayer insulating layer ILD1 may be disposed to cover the gate electrode GATE and the gate material layer GM. A metal pattern TM may be disposed on the first interlayer insulating layer ILD1. The metal pattern TM may be located at a location different from the location where the driving transistor DRT is formatted. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE may serve as a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 may be disposed to cover the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 may be disposed to cover the second source-drain electrode pattern SD2. A light emitting element ED may be disposed on the second planarization layer PLN2.

According to an example stack structure of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed to cover a portion of the anode electrode AE. A portion of the bank BANK corresponding to a light emitting area EA of the subpixel SP may be opened.

A portion of the anode electrode AE may be exposed through the opening (the opened portion) of the bank BANK. An emission layer EL may be positioned on side surfaces of the bank BANK and in the opening (the opened portion) of the bank BANK. All or at least a portion of the emission layer EL may be located between adjacent banks.

In the opening of the bank BANK, the emission layer EL may contact the anode electrode AE. A cathode electrode CE may be disposed on the emission layer EL.

The light emitting element ED can be formed by including the anode electrode AE, the emission layer EL, and the cathode electrode CE, as described above. The emission layer EL may include an organic material layer.

An encapsulation layer ENCAP may be disposed on the stack of the light emitting element ED.

The encapsulation layer ENCAP may have a single-layer structure or a multi-layer structure for example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic material layer, and the second encapsulation layer PCL may be, for example, an organic material layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, silicon nitride (SiNx), silicon oxide (SiOx), silicon oxynitride (SiON), aluminum oxide ($Al_2O_3$), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet scheme.

The second encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can minimize or prevent or at least reduce external moisture or oxygen from penetrating into the first encapsulation layer PAS1 and the second encapsulation layer PCL. For example, the third encapsulation layer PAS2 may include an inorganic insulating material, such as silicon nitride (SiNx), silicon oxide (SiOx), silicon oxynitride (SiON), aluminum oxide ($Al_2O_3$), or the like.

Referring to FIG. 7, in an example where a touch sensor TS is embedded into the display panel 110, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and at least one bridge metal BRG, which are located in different layers.

A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is disposed on the display panel 110, a chemical solution (e.g., a developer or etchant) used in the corresponding process or moisture from the outside may be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent or at least reduce damage to the emission layer EL, which is vulnerable to a chemical solution or moisture.

In order to prevent or at least reduce damage to the emission layer EL including an organic material, which is vulnerable to high temperatures, the touch buffer layer T-BUF can be formed at a low temperature less than or equal to a predetermined temperature (e.g., 100 degrees (° C.)) and be formed using an organic insulating material having a low permittivity of 1 to 3. For example, the touch buffer layer T-BUF may include an acrylic-based, epoxy-based, or silicon-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

Next, a stack structure of the first optical area OA1 will be described with reference to FIGS. 6 and 7.

Referring to FIGS. 6 and 7, the light emitting area EA of the first optical area OA1 may have the same stack structure as that in the normal area NA. Accordingly, in the discussion that follows, instead of repeatedly describing the light emitting area EA in the first optical area OA1, a stack structure of the first transmission area TA1 in the first optical area OA1 will be described in detail below.

In some embodiments, the cathode electrode CE may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the cathode electrode CE.

Further, in some embodiments, a light shield layer LS including at least one of the first metal layer ML1 and the second metal layer ML2 may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 may be disposed in the first transmission area TA1 in the first optical area OA1 equally, substantially equally, or similarly.

However, in some embodiments, all, or one or more, of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all, or one or more, of the metal material layers (ML1, ML2, GATE, GM, TM, SD1, SD2) related to at least one transistor and the semiconductor layer ACT may not be disposed in the first transmission area TA1.

Further, referring to FIGS. 6 and 7, in some embodiments, the anode electrode AE and the cathode electrode CE included in the light emitting element ED may not be disposed in the first transmission area TA1. In some embodiments, the emission layer EL of the light emitting element ED may or may not be disposed in the first transmission area TA1 according to a design requirement.

Further, referring to FIG. 7, in some embodiments, the touch sensor metal TSM and the bridge metal BRG included in the touch sensor TS may not be disposed in the first transmission area TA1 in the first optical area OA1.

Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. As a consequence, the first optical electronic device 11 can perform a predefined function (e.g., image sensing) by receiving light transmitting through the first transmission area TA1.

In some embodiments, since all, or one or more, of the first transmission area TA1 in the first optical area OA1 overlap the first optical electronic device 11, to enable the first optical electronic device 11 to normally operate, it is desired to further increase a transmittance of the first transmission area TA1 in the first optical area OA1.

To achieve the foregoing, in the display panel 110 of the display device 100 according to aspects of the present disclosure, a transmittance improvement structure TIS can be provided to the first transmission area TA1 in the first optical area OA1.

Referring to FIGS. 6 and 7, the plurality of insulating layers included in the display panel 110 may include at least one buffer layer (MBUF, ABUF1, ABUF2) between at least one substrate (SUB1, SUB2) and at least one transistor (DRT, SCT), at least one planarization layers (PLN1, PLN2) between the transistor DRT and the light emitting element ED, at least one encapsulation layer ENCAP on the light emitting element ED, and the like.

Referring to FIG. 7, the plurality of insulating layers included in the display panel 110 may further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 can have a structure (e.g., a recess, trench, concave, protrusion, etc.) in which the first planarization layer PLN1 and the passivation layer PAS0 have depressed portions that extend downward from respective surfaces thereof toward the substrate SUB as a transmittance improvement structure TIS.

Referring to FIGS. 6 and 7, among the plurality of insulating layers, the first planarization layer PLN1 may include at least one depression (e.g., a recess, a trench, a concave portion, a protrusion, or the like). The first planarization layer PLN1 may be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 may also have a depressed portion that extends downward from the surface thereof. In this embodiment, the second encapsulation layer PCL can substantially serve to provide planarization.

Referring to FIGS. 6 and 7, the depressed portions of the first planarization layer PLN1 and the passivation layer PAS0 may pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 6 and 7, the substrate SUB may include at least one concave portion or depressed portion as a transmittance improvement structure TIS. For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure TIS in which the first encapsulation layer PAS1 and the second encapsulation layer PCL have depressed portions that extend downward from the respective surfaces thereof toward the substrate SUB. The second encapsulation layer PCL may be, for example, an organic insulating layer.

Referring to FIG. 7, to protect the touch sensor TS, the protective layer PAC may be disposed to cover the touch sensor TS on the encapsulation layer ENCAP.

Referring to FIG. 7, the protective layer PAC may have at least one depression (e.g., a recess, a trench, a concave portion, a protrusion, or the like) as a transmittance improvement structure TIS in a portion overlapping the first transmission area TA1. The protective layer PAC may be, for example, an organic insulating layer.

Referring to FIG. 7, the touch sensor TS may include one or more touch sensor metals TSM with a mesh type. In the example where the touch sensor metal TSM is formed in the mesh type, a plurality of openings may be formed in the touch sensor metal TSM. Each of the plurality of openings may be located to correspond to the light emitting area EA of the subpixel SP.

In order for the first optical area OA1 to have a transmittance higher than the normal area NA, an area or size of the touch sensor metal TSM per unit area in the first optical area OA1 may be less than an area or size of the touch sensor metal TSM per unit area in the normal area NA.

Referring to FIG. 7, in some embodiments, the touch sensor TS may be disposed in the light emitting area EA in the first optical area OA1, but may not be disposed in the first transmission area TA1 in the first optical area OA1.

Next, a stack structure of the second optical area OA2 will be described with reference to FIGS. 6 and 7.

Referring to FIGS. 6 and 7, the light emitting area EA of the second optical area OA2 may have the same stack structure as that of the normal area NA. Accordingly, in the discussion that follows, instead of repeatedly describing the light emitting area EA in the second optical area OA2, a stack structure of the second transmission area TA2 in the second optical area OA2 will be described in detail below.

In some embodiments, the cathode electrode CE may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the cathode electrode CE.

Further, in some embodiments, a light shield layer LS including at least one of the first metal layer ML1 and the second metal layer ML2 may be disposed in the light emitting areas EA included in the normal area NA and the second optical area OA2, but may not be disposed in the first transmission area TA2 in the second optical area OA2. For example, the second transmission area TA2 in the second optical area OA2 may be corresponded to an opening of the light shield layer LS.

In an example where the transmittance of the second optical area OA2 and the transmittance of the first optical area OA1 are the same, the stack structure of the second transmission area TA2 in the second optical area OA2 may be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 may be different at least in part from as the stacked structure of the first transmission area TA1 in the first optical area OA1.

For example, as shown in FIGS. 6 and 7, in some embodiments, when the transmittance of the second optical area OA2 is less than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. Further, a width of the second transmission area TA2 in the second optical area OA2 may be less than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 may be disposed in the second transmission area TA2 in the second optical area OA2 equally, substantially equally, or similarly.

However, in some embodiments, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all, or one or more, of the metal material layers (ML1, ML2, GATE, GM, TM, SD1, SD2) related to at least one transistor and the semiconductor layer ACT may not be disposed in the second transmission area TA2 in the second optical area OA2.

Further, referring to FIGS. 6 and 7, in some embodiments, the anode electrode AE and the cathode electrode CE included in the light emitting element ED may not be disposed in the second transmission area TA2. In some embodiments, the emission layer EL of the light emitting element ED may or may not be disposed on the second transmission area TA2 according to a design requirement.

Further, referring to FIG. 7, in some embodiments, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 8:
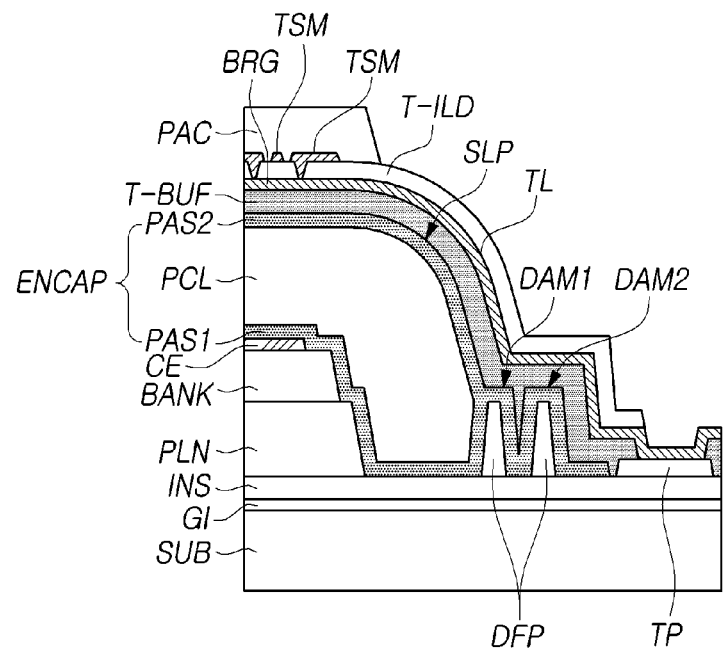
FIG. 8 is an example cross-sectional view in an outer edge of the display panel according to an embodiment of the present disclosure.

FIG. 8 is an example cross-sectional view in an outer edge of the display panel according to an embodiment of the present disclosure.

Figure 9:
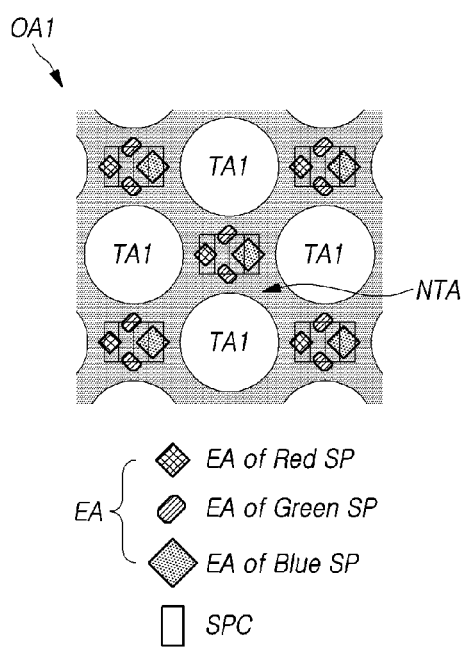
FIG. 9 illustrates an example portion of the first optical area of the display device according to an embodiment of the present disclosure.

For the sake of brevity, in FIG. 8, a single substrate SUB including the first substrate SUB1 and the second substrate SUB2 is illustrated, and layers or portions located under the bank BANK are illustrated in a simplified manner. Likewise, FIG. 9 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 8, the first encapsulation layer PAS1 may be disposed on the cathode electrode CE and disposed closest to the light emitting element ED. The second encapsulation layer PCL may have a smaller area or size than the first encapsulation layer PAS1. For example, the second encapsulation layer PCL may be disposed to expose both ends or edges of the first encapsulation layer PAS1.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1.

The third encapsulation layer PAS2 can reduce or prevent external moisture or oxygen from penetrating into the first encapsulation layer PAS1 and the second encapsulation layer PCL.

Referring to FIG. 8, in order to prevent or at least reduce the encapsulation layer ENCAP from collapsing, the display panel 110 may include one or more dams (DAM1, DAM2) at, or near to, an end or edge of an inclined surface SLP of the encapsulation layer ENCAP. The one or more dams (DAM1, DAM2) may be present at, or near to, a boundary point between the display area DA and the non-display area NDA.

The one or more dams (DAM1, DAM2) may include the same material DFP as the bank BANK.

Referring to FIG. 8, in one embodiment, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1, DAM2). In another embodiment, the second encapsulation layer PCL including an organic material may be located on at least the first dam DAM1 of the first dam DAM1 and a second dam DAM2.

For example, the second encapsulation layer PCL may extend only up to all, or at least a portion, of an upper portion of the first dam DAM1. In further another embodiment, the second encapsulation layer PCL may extend past the upper portion of the first dam DAM1 and extend up to all, or at least a portion of, an upper portion of the secondary dam DAM2.

Referring to FIG. 8, a touch pad TP, to which the touch driving circuit 260, as shown in FIG. 2, is electrically connected, may be disposed on a portion of the substrate SUB outside of the one or more dams (DAM1, DAM2).

A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP.

The touch line TL may run downward along the inclined surface SLP of the encapsulation layer ENCAP, run along the respective upper portions of the dams (DAM1, DAM2), and extend up to the touch pad TP disposed outside of the dams (DAM1, DAM2).

Referring to FIG. 8, in one embodiment, the touch line TL may be the bridge metal BRG. In another embodiment, the touch line TL may be the touch sensor metal TSM.

FIG. 9 illustrates an example portion of a first optical area (e.g., the first optical area OA1 in the figures discussed above) of the display device 100 according to one embodiment of the present disclosure.

Referring to FIG. 9, the first optical area OA1 may include a plurality of first transmission areas (e.g., the first transmission areas TA1 in the figures discussed above), and may include a non-transmission area NTA except for the plurality of first transmission areas TA1.

Light emitting areas EA of subpixels SP may be disposed in the non-transmission area NTA. One light emitting area EA may correspond to an area in which one anode electrode AE or one emission layer EL is disposed.

One or more respective circuit portions SPC of one or more subpixels SP may be disposed in the non-transmission area NTA. Circuit components (e.g., one or more transistors, one or more storage capacitors, and other components) for driving a light emitting element ED of a subpixel SP may be included in the circuit portion SPC of the subpixel SP.

As illustrated in FIG. 9, in one embodiment, the light emitting area EA and the circuit portion SPC of one subpixel SP may overlap each other. In another embodiment, the light emitting area EA and the circuit portion SPC of one subpixel SP may not overlap each other.

Hereinafter, an example structure of each subpixel SP in the non-transmission area NTA of the first optical area OA1 will be described with reference to FIG. 10.

Figure 10:
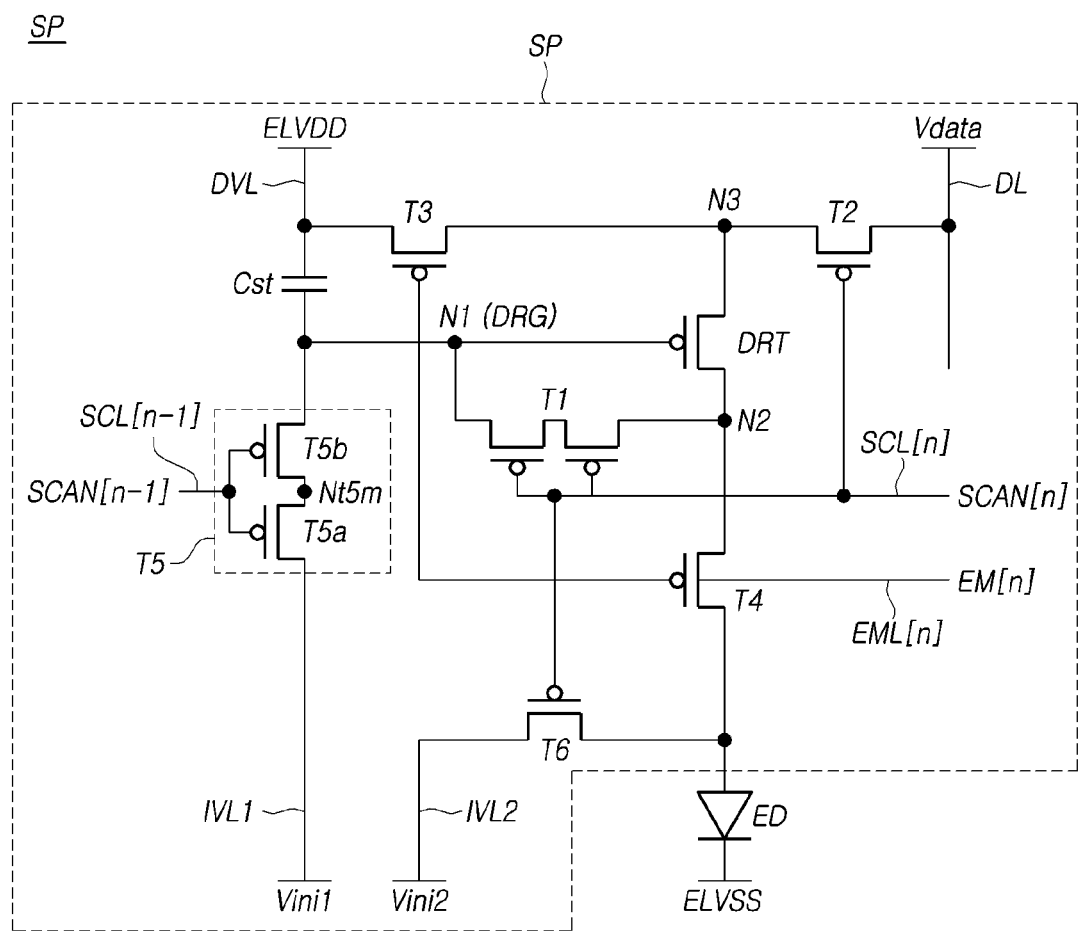
FIG. 10 illustrates an example equivalent circuit of a subpixel included in the display device according to an embodiment of the present disclosure.

FIG. 10 illustrates an example equivalent circuit of a subpixel SP included in the display device 100 according to one embodiment of the present disclosure.

Referring to FIG. 9, each of two or more subpixels SP may include a circuit portion SPC for driving a corresponding light emitting element ED. The circuit portion SPC may include a driving transistor DRT, first to sixth transistors T1 to T6, a storage capacitor Cst, and the like.

The light emitting element ED can include an anode electrode AE, an emission layer EL, and a cathode electrode CE. The light emitting element ED may be, for example, an organic light emitting diode (OLED), an inorganic light emitting diode, a quantum dot light emitting element, or the like.

The driving transistor DRT may include a first node N1, a second node N2, and a third node N3, and may be a transistor for driving the light emitting element ED.

The first node N1 of the driving transistor DRT may be the gate node of the driving transistor DRT. The second node N2 of the driving transistor DRT may be a drain node or a source node of the driving transistor DRT. The third node N3 of the driving transistor DRT may be the source node or the drain node of the driving transistor DRT.

The first transistor T1 can control a connection between the first node N1 and the second node N2 of the driving transistor DRT.

The second transistor T2 can control a connection between the third node N3 of the driving transistor DRT and a data line DL.

The third transistor T3 can control a connection between the third node N3 of the driving transistor DRT and a driving voltage line DVL.

The fourth transistor T4 can control a connection between the second node N2 of the driving transistor DRT and the light emitting element ED.

The fifth transistor T5 can control a connection between the first node N1 of the driving transistor DRT and a first initialization voltage line IVL1.

The sixth transistor T6 can control a connection between the light emitting element ED and a second initialization voltage line IVL2.

The storage capacitor Cst may be connected between the first node N1 of the driving transistor DRT and the driving voltage line DVL.

The gate node of the first transistor T1, the gate node of the second transistor T2, and the gate node of the sixth transistor T6 may be commonly electrically connected to one first scan line SCL[n].

Respective turn-ons and turn-offs of the first transistor T1, the second transistor T2, and the sixth transistor T6 may be commonly controlled by a first scan signal SCAN[n] supplied from the first scan line SCL[n].

The gate node of the third transistor T3 and the gate node of the fourth transistor T4 may be commonly electrically connected to one emission control line EML[n].

The third transistor T3 and the fourth transistor T4 may be commonly controlled by an emission control signal EM[n] supplied from the emission control line EML[n].

The turn-on and turn-off of the fifth transistor T5 may be controlled by a second scan signal SCAN[n−1] supplied from a second scan line SCL[n−1].

For example, the first transistor T1 may be a dual transistor having two channels. In an embodiment, the first transistor T1 may include two partial transistors, of which respective turn-ons and turn-offs are controlled together, or substantially simultaneously, by one first scan signal SCAN[n] supplied from one first scan line SCL[n]. The two partial transistors included in the first transistor T1 may be connected in series between the first node N1 and the second node N2.

For example, the fifth transistor T5 may be a dual transistor having two channels and a connection node Nt5m between the two channels. In an embodiment, the fifth transistor T5 may include two partial transistors T5a and T5b, of which respective turn-ons and turn-offs are controlled together, or substantially simultaneously, by one second scan signal SCAN[n−1] supplied from one second scan line SCL[n−1]. The two partial transistors T5a and T5b included in the fifth transistor T5 may be connected in series between the first node N1 and the first initialization voltage line IVL1.

In one embodiment, all of the seven transistors (DRT, and T1 to T6) included in each subpixel SP may be p-type transistors or n-type transistors. In another embodiment, at least one of the seven transistors (DRT, and T1 to T6) may be a p-type or n-type transistor, and the remaining transistors may be n-type or p-type transistors.

For example, among the seven transistors (DRT, T1 to T6), the first transistor T1 may be an n-type transistor, and the remaining six transistors (DRT, and T2 to T6) may be p-type transistors.

In some embodiments, the storage capacitor Cst may be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Figure 11:
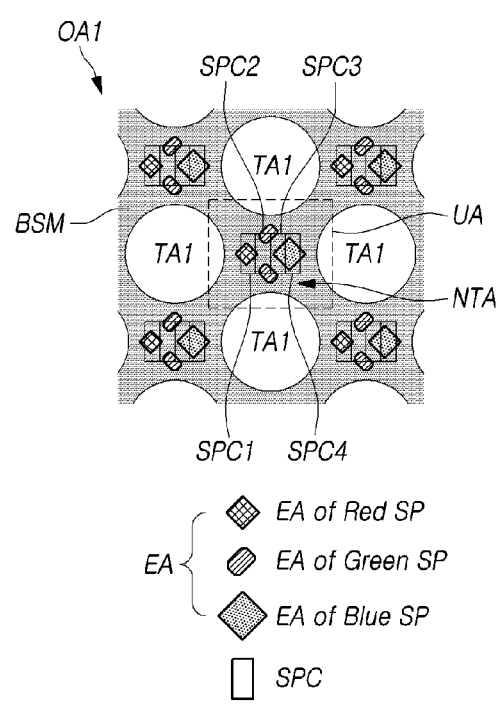
FIG. 11 illustrates an example arrangement of a lower shield metal BSM in a non-transmission area NTA in a portion of the first optical area OA1 of the display device 100 according to an embodiment of the present disclosure.

FIG. 11 illustrates an example arrangement of a lower shield metal BSM disposed in a non-transmission area NTA in a portion of a first optical area (e.g., the first optical area OA1 in the figures discussed above) of the display device 100 according to one embodiment of the present disclosure.

Referring to FIG. 11, the first optical area OA1 may include a plurality of first transmission areas TA1 and a non-transmission area NTA.

Referring to FIG. 11, the non-transmission area NTA may be the remaining areas except for the plurality of first transmission areas TA1 in the first optical area OA1. The non-transmission area NTA may include respective light emitting areas EA of subpixels SP and respective circuit portions SPC of the subpixels SP.

In one embodiment, the light emitting areas EA and the circuit portions SPC of subpixels may at least partially overlap each other. Patterns and/or shapes in which the light emitting areas EA of subpixels SP are disposed may be different from patterns and/or shapes in which the circuit portions SPC of the subpixels SP are disposed.

In another embodiment, the light emitting areas EA and the circuit portions SPC of subpixels may not overlap each other.

Referring to FIG. 11, in order to improve the transmittance of the first transmission areas TA1 of the first optical area OA1, a cathode electrode (e.g., the cathode electrode CE in the figures discussed above) may be patterned. Through such cathode patterning, in the first optical area OA1, the cathode electrode CE may be disposed in the non-transmission area NTA and may not be disposed in the first transmission areas TA1.

Referring to FIG. 11, through the cathode patterning, the cathode electrode CE may have a plurality of transmission holes. The plurality of transmission holes of the cathode electrode CE may correspond to the first transmission areas TA1 of the first optical area OA1.

Referring to FIG. 11, when the cathode patterning is performed, each of the plurality of transmission holes of the cathode electrode CE may be patterned in a circular shape so that each of the first transmission areas TA1 can be formed in a circular shape to prevent a flare defect.

Referring to FIG. 11, the cathode patterning may be performed using a laser. When the cathode patterning process is performed using a laser, the laser may be irradiated toward the substrate SUB from a location below the substrate SUB. During this process, some circuit components such as the light emitting element ED, the transistors (DRT, T1 to T6), or the capacitor Cst can be damaged by the laser.

Referring to FIG. 11, a lower shield metal BSM may be disposed in the non-transmission area NTA of the first optical area OA1 to prevent or a least reduce damage to circuit components during the cathode patterning process.

Referring to FIG. 11, in order to prevent or at least reduce the damage to the transistors (DRT, T1 to T6), the lower shield metal BSM may be disposed under all, or one or more, of the transistors (DRT, T1 to T6).

A metal forming the lower shield metal BSM may be also used to form the storage capacitor Cst. For example, the storage capacitor may have a structure in which two capacitors are connected using the lower shield metal BSM, an active layer, and a gate metal layer.

The lower shield metal BSM may be used to form the storage capacitor Cst, and a driving voltage ELVDD may be applied to one of two plates used for forming the storage capacitor Cst. The plate to which the driving voltage ELVDD is applied among the two plates may be the lower shield metal BSM.

Figure 12:
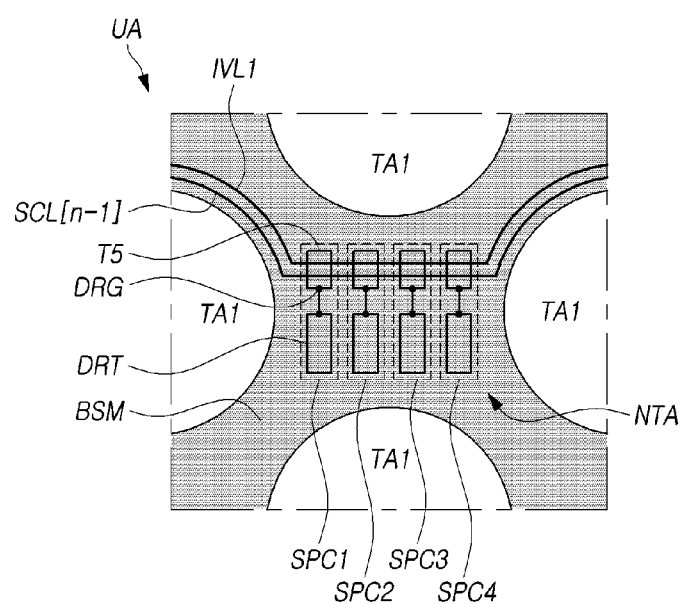
FIG. 12 is a plan view of an area labeled UA in FIG. 11 according to an embodiment of the present disclosure.

FIG. 12 is a plan view of an area labeled UA in FIG. 11 according to one embodiment.

In the first optical area OA1, two or more subpixels SP may be disposed in a non-transmission area NTA between adjacent first transmission areas TA1. Further, in the first optical area OA1, two or more respective circuit portions SPC of the two or more subpixels SP may be disposed in the non-transmission area NTA between adjacent first transmission areas TA1.

In the example of FIG. 12, in the first optical area OA1, four subpixels SP may be disposed in a non-transmission area NTA between four adjacent first transmission areas TA1. Further, in the first optical area OA1, four respective circuit portions (SPC1, SPC2, SPC3, and SPC4) of the four subpixels SP may be disposed in the non-transmission area NTA between adjacent four transmission areas TA1.

In an example where each subpixel SP has the structure shown in FIG. 9, each of the four circuit portions (SPC1, SPC2, SPC3, and SPC4) of the four subpixels SP may include a driving transistor DRT, first to sixth transistors T1 to T6 and a storage capacitor Cst.

Hereinafter, with respect to the circuit portions (SPC1, SPC2, SPC3, and SPC4) of the four subpixels SP, discussions will be provided based on the fifth transistor T5 as shown in FIG. 10. During an initialization period among periods related to the driving of subpixels SP, the fifth transistor T5 is a transistor used to initialize a voltage at the gate node DRG of the driving transistor DRT.

The fifth transistor T5 may switch a connection between the first node N1, which is the gate node DRG of the driving transistor DRT, and the first initialization voltage line IVL1.

A second scan signal SCAN[n−1] supplied from the second scan line SCL[n−1] may be applied to the gate node of the fifth transistor T5.

The second scan line SCL[n−1] and the first initialization voltage line IVL1 may be disposed in the horizontal direction, and be first horizontal lines HL1 running through the first optical area OA1.

The second scan line SCL[n−1] and the first initialization voltage line IVL1 may be disposed through the first optical area OAL and for example, disposed so as to avoid one or more first transmission areas TA1 of the first optical area OA1.

Referring to FIG. 12, a lower shield metal BSM may be disposed in a non-transmission area NTA between adjacent first transmission areas TA1 in the first optical area OA1.

Referring to FIG. 12, when cathode patterning is performed for forming first transmission areas TA1 in the first optical area OAL even when a laser is irradiated toward the rear surface of the substrate SUB, the laser can be blocked by the lower shield metal BSM, and thereby, circuit components (e.g., transistors, capacitors, light emitting elements, and other components) located one or over the lower shield metal BSM in the non-transmission area NTA can be prevented from being damaged by the laser.

Figure 13:
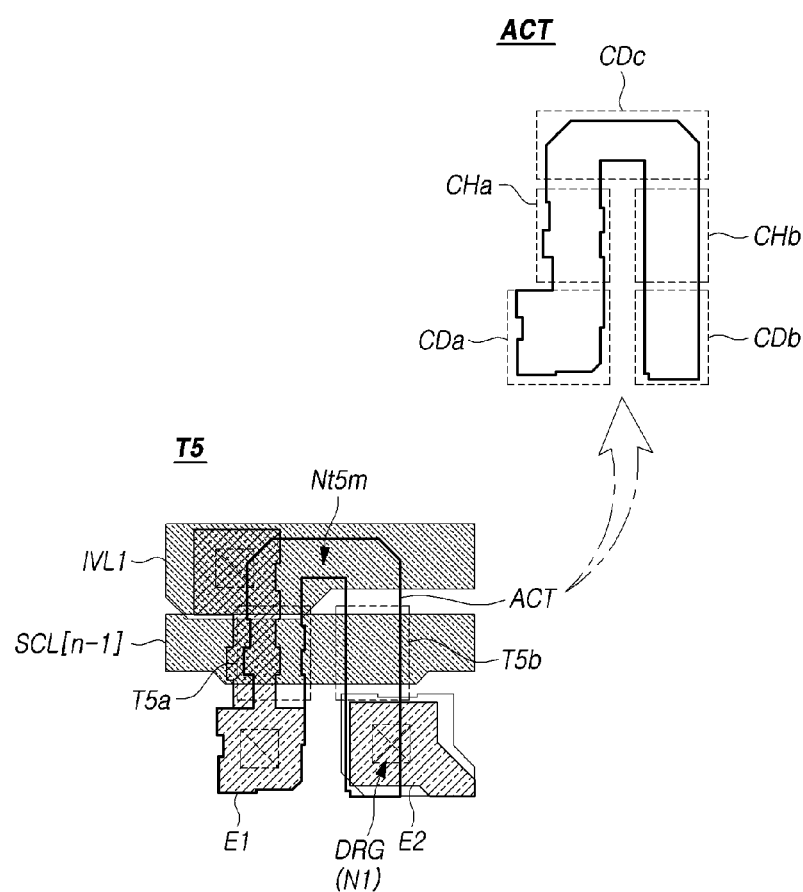
FIG. 13 illustrates an example structure of a fifth transistor according to an embodiment of the present disclosure.

FIG. 13 illustrates an example structure of the fifth transistor T5 according to one embodiment.

Referring to FIG. 13, the fifth transistor T5 may be a dual transistor including two partial transistors T5a and T5b.

Respective gate nodes of the two partial transistors T5a and T5b may be electrically connected to each other. The two partial transistors T5a and T5b may be connected in series between the gate node DRG of the driving transistor DRT and the first initialization voltage line IVL1.

The fifth transistor T5 may be a dual transistor including two channels overlapping one second scan line SCL[n−1] and a connection node Nt5m between the two channels.

For example, referring to FIG. 13, the fifth transistor T5 may include a first electrode E1 electrically connected to the first initialization voltage line IVL1, a second electrode E2 electrically connected to the first node N1 of the driving transistor DRT, an active layer ACT, and the like.

The active layer ACT may include a first conductive portion CDa, a second conductive portion CDb, a first channel region CHa, a second channel region CHb, and a connection conductive portion CDc. For example, the first channel region CHa and the second channel region CHb may be non-conductive semiconductors, and the first conductive portion CDa, the second conductive portion CDb, and the connection conductive portion CDc may be conductive semiconductors. For example, the active layer ACT may be an oxide semiconductor.

Referring to FIG. 13, the first conductive portion CDa may be electrically connected to the first electrode E1. The second conductor portion CDb may be electrically connected to the second electrode E2.

Referring to FIG. 13, the first channel region CHa may be located between the first conductive portion CDa and the connection conductive portion CDc. The second channel region CHb may be located between the second conductive portion CDb and the connection conductive portion CDc.

Referring to FIG. 13, the connection conductive portion CDc may correspond to the connection node Nt5m. The connection conductive portion CDc may be located between the first channel region CHa and the second channel region CHb. The connection conductive portion CDc may at least partially overlap the first initialization voltage line IVL1.

Referring to FIG. 13, the first channel region CHa and the second channel region CHb may overlap one second scan line SCL[n−1], for example, first and second portions thereof, respectively. The one second scan line SCL[n−1] overlapping both the first channel region CHa and the second channel region CHb may serve as the gate electrode of the fifth transistor T5.

Referring to FIG. 13, the first electrode E1 may intersect the second scan line SCL[n−1].

Referring to FIG. 13, one end or edge of the first electrode E1 may be electrically connected to the first conductive portion CDa, and the other end or edge of the first electrode E1 may be electrically connected to the first initialization voltage line IVL1. A portion between one end or edge and the other end or edge of the first electrode E1 may overlap the second scan line SCL[n−1].

Figure 14:
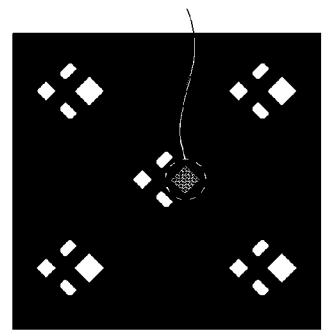
FIG. 14 illustrates a result of an example lighting experiment on the first optical area of the display device according to an embodiment of the present disclosure.

FIG. 14 illustrates a result of an example lighting experiment on the first optical area OA1 of the display device 100 according to one embodiment of the present disclosure.

Referring to FIG. 14, in order to prevent or at least reduce damage to the transistors (DRT, T1 to T6), a lower shield metal (e.g., the lower shield metal BSM in the figures discussed above) may be disposed under all, or one or more, of transistors (DRT, T1 to T6).

A metal forming the lower shield metal BSM may be also used to form the storage capacitor Cst. For example, the storage capacitor may have a structure in which two capacitors are connected using the lower shield metal BSM, an active layer, and a gate metal layer.

The lower shield metal BSM may be used to form the storage capacitor Cst, and a driving voltage ELVDD may be applied to one of two plates used for forming the storage capacitor Cst. The plate to which the driving voltage ELVDD is applied among the two plates may be the lower shield metal BSM.

As described above, a driving voltage ELVDD may be applied to the lower shield metal BSM. Accordingly, there may occur a phenomenon in which threshold voltages of transistors located over the lower shield metal BSM to which a driving voltage ELVDD is applied are shifted. For example, the threshold voltages may be shifted to lower levels of voltages (i.e., a decreasing direction or a negative direction).

For example, due to the lower shield metal BSM located under transistors in the first optical area OA1, threshold voltages thereof, which are unique characteristics of all of the transistors disposed in the first optical area OA1, may be shifted to lower levels of voltages. In particular, in a high temperature or high humidity environment, the shifting of the threshold voltages to negative values may be more severely progressed. In turn, image quality in the first optical area OA1 may be deteriorated.

In particular, in a situation where the threshold voltage of the fifth transistor T5 used for initialization driving and configured with a dual transistor among transistors (DRT, and T1 to T6) included in each subpixel SP is shifted to a lower level of voltage, the initialization driving of a corresponding subpixel may not normally performed, and in turn, the quality of an image displayed in the first optical area OA1 may be severely deteriorated.

In a situation where threshold voltages of fifth transistors T5 in subpixels SP disposed in a non-transmission area NTA of the first optical area OA1 are greatly shifted to lower levels of voltages by a lower shield metal BSM disposed in the non-transmission area NTA of the first optical area OA1, this may cause the subpixels SP disposed in the non-transmission area NTA of the first optical area OA1 to be shown in the form of dark spots.

FIGS. 15A to 15D illustrate example open structures of a lower shield metal BSM disposed in a first optical area (e.g., the first optical area OA1 in the figures discussed above) of the display device 100 according to aspects of the present disclosure.

The display device 100 according to aspects of the present disclosure will be briefly described again. The display device 100 may include the display panel 110 and the first optical electronic device 11 located under, or in a lower portion of, the display panel 110.

The display panel 110 may include the display area DA and the non-display area NDA. The display area DA may include the first optical area OA1 and the normal area NA located outside of the first optical area OA1. The first optical area OA1 may include a plurality of light emitting areas EA and a plurality of first transmission areas TA1. The normal area NA may include a plurality of light emitting areas EA.

The first optical electronic device 11 may be located under, in a lower portion of, the display panel 110 and overlap at least a portion of the first optical area OA1.

The display panel 110 may further include two or more subpixels SP disposed in a non-transmission area NTA between adjacent first transmission areas TA1 in the first optical area OA1.

The display panel 110 may further include a lower shield metal BSM disposed in the non-transmission area NTA between the adjacent first transmission areas TA1 in the first optical area OA1.

Each of the two or more subpixels SP disposed in the non-transmission area NTA of the first optical area OA1 may include a light emitting element ED, two or more transistors (DRT, and T1 to T6), and a storage capacitor Cst.

Referring to FIGS. 15A to 15D, in a non-transmission area NTA between adjacent first transmission areas TA1 in the first optical area OA1, a lower shield metal BSM may include at least one opening OPH.

The at least one opening OPH of the lower shield metal BSM may overlap all, or at least a portion, of a specific transistor among two or more transistors (DRT, T1 to T6) included in each of two or more subpixels SP.

For example, the specific transistor may be an initialization transistor for transmitting a first initialization voltage Vini1 to the first node N1 corresponding to the gate node DRG of the driving transistor DRT.

For example, the specific transistor may be the fifth transistor T5 included in the circuit portion SPC of the subpixel SP of FIG. 10. The fifth transistor T5 may be an initialization transistor.

For example, the specific transistor may be a dual transistor including two channels overlapping one second scan line SCL[n−1] and a connection node Nt5m between the two channels.

In some embodiments, the display panel 110 may include a substrate SUB, a lower shield metal BSM over the substrate SUB, a buffer layer on the lower shield metal BSM, and a transistor layer on the buffer layer.

The substrate SUB may include a display area DA and a non-display area NDA, and the display area DA may include a first optical area OA1 and a normal area NA located outside of the first optical area OA1.

The lower shield metal BSM may correspond to the light shield layer LS of FIGS. 6 and 7. The buffer layer on the lower shield metal BSM may correspond to the second active buffer layer ABUF2 of FIGS. 6 and 7.

The first optical area OA1 may include a plurality of light emitting areas EA and a plurality of first transmission areas TA1, and at least a portion of the first optical area OA1 may overlap a first optical electronic device 11 located under the substrate SUB.

Two or more subpixels SP may be disposed in a non-transmission area NTA between adjacent first transmission areas TA1 in the first optical area OA1.

Each of the two or more subpixels SP disposed in the non-transmission area NTA of the first optical area OA1 may include a light emitting element ED, two or more transistors (DRT, and T1 to T6), and a storage capacitor Cst.

The lower shield metal BSM may be disposed in the non-transmission area NTA of the first optical area OA1 and may include at least one opening OPH.

The at least one opening OPH of the lower shield metal BSM may overlap all, or at least a portion, of a specific transistor among two or more transistors (DRT, T1 to T6) included in each of two or more subpixels SP.

For example, the specific transistor may be an initialization transistor for transmitting a first initialization voltage Vini1 to the first node N1 corresponding to the gate node DRG of the driving transistor DRT.

For example, the specific transistor may be the fifth transistor T5 included in the circuit portion SPC of the subpixel SP of FIG. 10. The fifth transistor T5 may be an initialization transistor.

For example, the specific transistor may be a dual transistor including two channels overlapping one second scan line SCL[n−1] and a connection node Nt5m between the two channels.

Figure 15A:
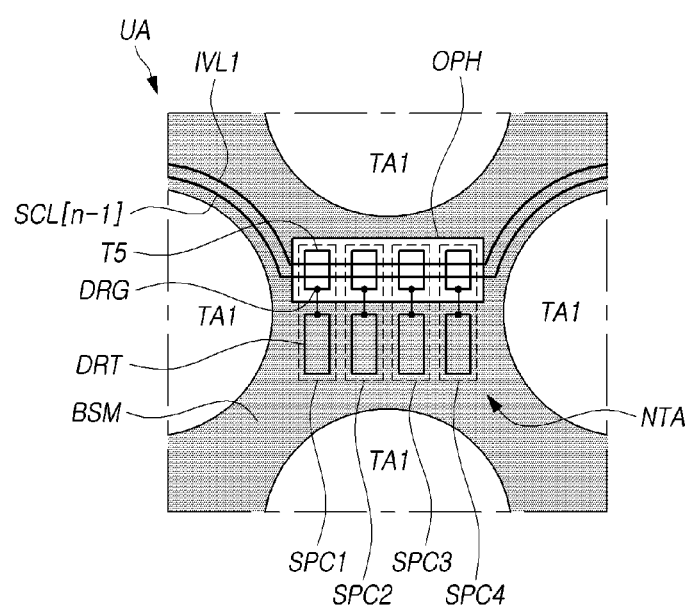
FIGS. 15A to 15D illustrate example open structures of the lower shield metal disposed in the first optical area in the display device according to embodiments of the present disclosure.
Figure 15B:
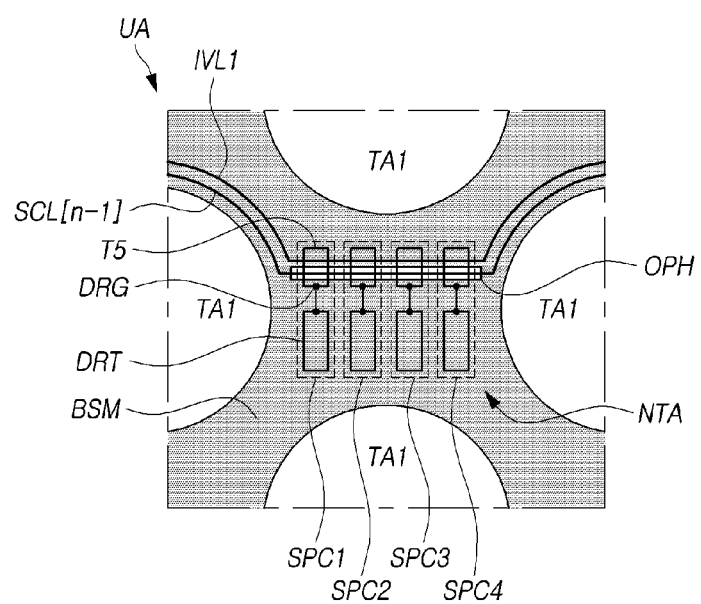

Referring to FIGS. 15A and 15B, a first subpixel SP and a second subpixel SP among the two or more subpixels SP may be disposed in the non-transmission area NTA between adjacent first transmission areas TA1 in the first optical area OA1.

Referring to FIGS. 15A and 15B, in the non-transmission area NTA between adjacent first transmission areas TA1 in the first optical area OA1, the lower shield metal BSM may include one opening OPH extending across a first circuit portion SPC1 of the first subpixel SP and a second circuit portion SPC2 of the second subpixel SP.

Referring to FIG. 15A, the one opening OPH may overlap two channels and a connection node Nt5m of a specific transistor included in the first circuit portion SPC1 of the first subpixel SP, and may overlap two channels and a connection node Nt5m of a specific transistor included in the second circuit portion SPC2 of the second subpixel SP.

The one opening OPH in FIG. 15A may overlap the second scan line SCL[n−1] and the first initialization voltage line IVL1.

Referring to FIG. 15B, the one opening OPH may overlap two channels of a specific transistor included in the first circuit portion SPC1 of the first subpixel SP, and may overlap two channels of a specific transistor included in the second circuit portion SPC2 of the second subpixel SP.

Referring to FIG. 15B, the one opening OPH may not overlap a connection node Nt5m of the specific transistor included in the first circuit portion SPC1 of the first subpixel SP, and may not overlap a connection node Nt5m of the specific transistor included in the second circuit portion SPC2 of the second subpixel SP.

The one opening OPH in FIG. 15B may overlap the second scan line SCL[n−1] and not overlap the first initialization voltage line IVL1.

Figure 15C:
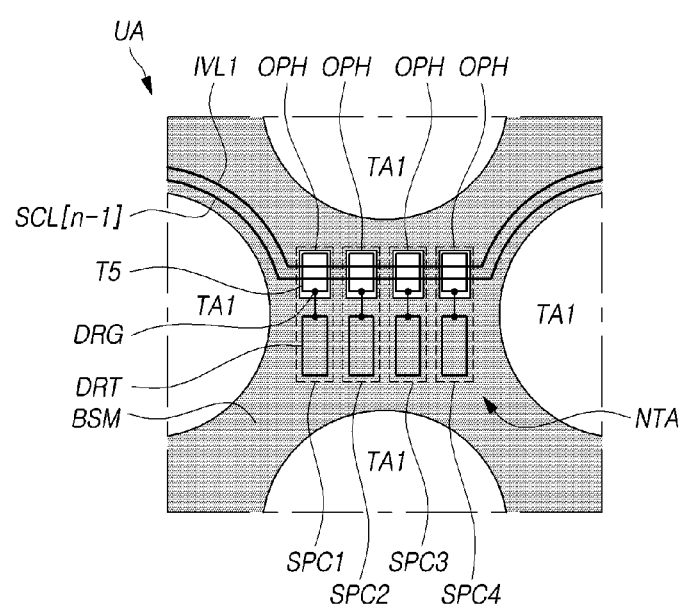
Figure 15D:
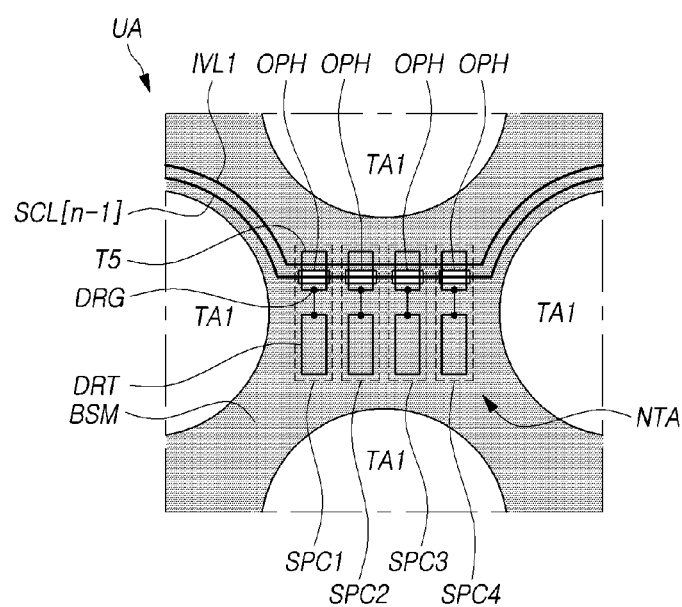

Referring to FIGS. 15C and 15D, a first subpixel SP and a second subpixel SP among the two or more subpixels SP may be disposed in the non-transmission area NTA between adjacent first transmission areas TA1 in the first optical area OA1.

Referring to FIGS. 15C and 15D, in the non-transmission area NTA between adjacent first transmission areas TA1 in the first optical area OA1, the lower shield metal BSM may include a first opening OPH overlapping a portion of a first circuit portion SPC1 of the first subpixel SP and a second opening OPH overlapping a portion of a second circuit portion SPC2 of the second subpixel SP.

Referring to FIG. 15C, the first opening OPH may overlap two channels and a connection node Nt5m of a specific transistor included in the first circuit portion SPC1 of the first subpixel SP.

Referring to FIG. 15C, the second opening OPH may overlap two channels and a connection node Nt5m of a specific transistor included in the second circuit portion SPC2 of the second subpixel SP.

The first opening OPH and the second opening OPH in FIG. 15C may overlap the second scan line SCL[n−1] and the first initialization voltage line IVL1.

Referring to FIG. 15D, the first opening OPH may overlap two channels of a specific transistor included in the first circuit portion SPC1 of the first subpixel SP, and may not overlap a connection node Nt5m of the specific transistor included in the first circuit portion SPC1 of the first subpixel SP.

Referring to FIG. 15D, the second opening OPH may overlap two channels of a specific transistor included in the second circuit portion SPC2 of the second subpixel SP, and may not overlap a connection node Nt5m of the specific transistor included in the second circuit portion SPC2 of the second subpixel SP.

The first opening OPH and the second opening OPH in FIG. 15D may overlap the second scan line SCL[n−1] and may not overlap the first initialization voltage line IVL1.

Figure 16A:
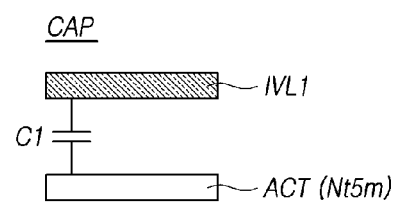
FIGS. 16A and 16B illustrate example capacitor structures formed across a connection node of the fifth transistor according to open structures of the lower shield metal in the display device according to an embodiment of the present disclosure.
Figure 16B:
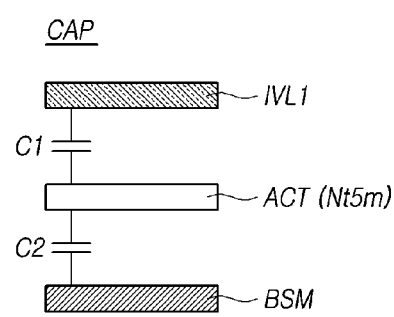

FIGS. 16A and 16B illustrate capacitors CAP formed across the connection node Nt5m of the fifth transistor T5 according to open structures of the lower shield metal BSM.

Referring to FIG. 16A, in an example where an opening OPH of the lower shield metal BSM is present at a point of the fifth transistor T5 where the connection node Nt5m overlapping the first initialization voltage line IVL1 is placed (as in the configurations of FIGS. 15A and 15C), single capacitor coupling can be formed at the connection node Nt5m of the fifth transistor T5.

In this example, the connection node Nt5m of the fifth transistor T5 may correspond to the connection conductive portion CDc of the active layer ACT of the fifth transistor T5. The connection conductive portion CDc of the active layer ACT of the fifth transistor T5 may overlap the first initialization voltage line IVL1.

Referring to FIG. 16A, in an example where an opening OPH of the lower shield metal BSM is present at a point where the connection node Nt5m of the fifth transistor T5 is placed, the connection conductive portion CDc of the active layer ACT of the fifth transistor T5, which is the connection node Nt5m of the fifth transistor T5, and the first initialization voltage line IVL1 may overlap, and thereby, a first capacitor C1 can be formed.

Referring to FIG. 16B, in an example where an opening OPH of the lower shield metal BSM is not present at a point of the fifth transistor T5 where the connection node Nt5m overlapping the first initialization voltage line IVL1 is placed (as in the configurations of FIGS. 15B and 15D), double capacitor coupling can be formed at the connection node Nt5m of the fifth transistor T5.

In this example, the connection node Nt5m of the fifth transistor T5 may correspond to the connection conductive portion CDc of the active layer ACT of the fifth transistor T5. The connection conductive portion CDc of the active layer ACT of the fifth transistor T5 may overlap the first initialization voltage line IVL1.

Referring to FIG. 16B, in an example where an opening OPH of the lower shield metal BSM is not present at a point where the connection node Nt5m of the fifth transistor T5 is placed (i.e., the lower shield metal BSM is present at a point where the connection node Nt5m of the fifth transistor T5 is placed), the connection conductive portion CDc of the active layer ACT of the fifth transistor T5, which is the connection node Nt5m of the fifth transistor T5, and the first initialization voltage line IVL1 may overlap, and thereby, the first capacitor C1 can be formed.

The connection conductive portion CDc of the active layer ACT of the fifth transistor T5, which is the connection node Nt5m of the fifth transistor T5, and the lower shield metal BSM may overlap, and thereby, a second capacitor C2 can be formed. In this example, a driving voltage ELVDD may be applied to the lower shield metal BSM.

Figure 17:
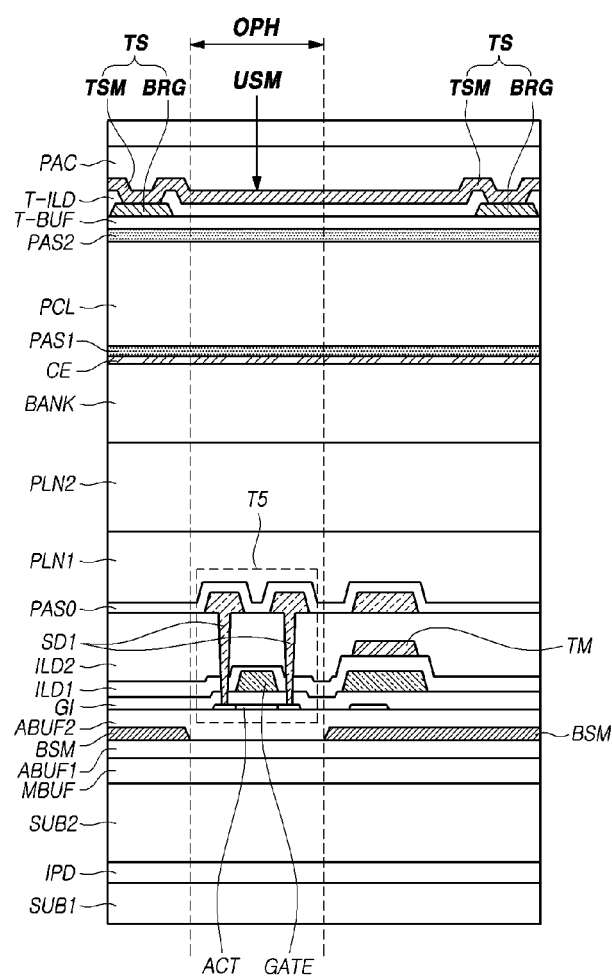
FIG. 17 illustrates an example cross-sectional view of a non-transmission area in which the fifth transistor is disposed in the first optical area in the display device according to an embodiment of the present disclosure.

FIG. 17 illustrates an example cross-sectional view of a non-transmission area NTA in which the fifth transistor T5 is disposed in the first optical area OA1 in the display device 100 according to one embodiment of the present disclosure. FIGS. 18A to 18E illustrate example cross-sectional views of a non-transmission area NTA in which the fifth transistor T5 is not disposed in the first optical area OA1 in the display device 100 according to one embodiment of the present disclosure. Considering that cross-sectional views of FIGS. 17 and 18A to 18E have structures in which an open structure of a lower shield metal BSM and an upper shield metal USM are further applied to the vertical structure of FIG. 7, discussions on like layers or substantially the same layers are not repeated here for brevity.

The display panel 110 may further include the upper shield metal USM overlapping at least one opening OPH of the lower shield metal BSM and located in a higher layer than a layer in which the lower shield metal BSM is disposed. Thus, the upper shield metal USM is father from the substrate SUB1 than the lower shield metal BSM.

The upper shield metal USM may include various metal materials located in the higher layer than the layer on which the lower shield metal BSM is disposed.

The upper shield metal USM may cover (e.g., overlap) at least one opening OPH of the lower shield metal BSM, and therefore, flare and haze phenomena that may occur during an associated process such as cathode patterning can be reduced or prevented by the at least one opening OPH of the lower shield metal BSM.

Referring to FIG. 17, in a non-transmission area NTA of a first optical area (e.g., the first optical area OA1 in the figures discussed above), the lower shield metal BSM may have an opening OPH overlapping all or at least a portion of the fifth transistor T5.

Referring to FIG. 17, in one embodiment, the upper shield metal USM may include a touch sensor metal TSM overlapping the opening OPH of the lower shield metal BSM. In this embodiment, the touch sensor metal TSM, which is the upper shield metal USM, may cover the opening OPH of the lower shield metal BSM.

In another embodiment, unlike FIG. 17, the upper shield metal USM may be formed with the bridge metal BRG instead of the touch sensor metal TSM. In this embodiment, the bridge metal BRG, which is the upper shield metal USM, may cover the opening OPH of the lower shield metal BSM.

In further another embodiment, the upper shield metal USM may be formed with a double metal including the touch sensor metal TSM and the bridge metal BRG. In this embodiment, the touch sensor metal TSM and the bridge metal BRG, which is the upper shield metal USM, may cover the opening OPH of the lower shield metal BSM.

Referring to FIGS. 18A to 18E, the upper shield metal USM may include various metal materials located in a higher layer than the lower shield metal BSM.

For example, the upper shield metal USM may include one or more of a gate metal GM, a source-drain metal (SD1 or SD2), an anode electrode metal AM, and one or more other metals TM.

Figure 18A:
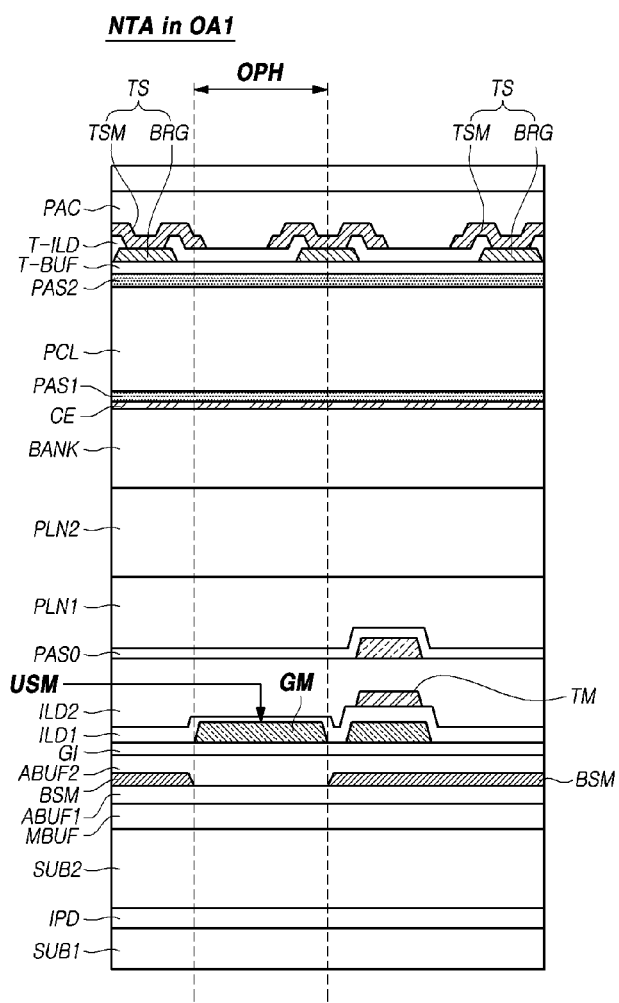
FIGS. 18A and 18E illustrate example cross-sectional views of a non-transmission area in which the fifth transistor is not disposed in the first optical area in the display device according to embodiments of the present disclosure.

Referring to FIG. 18A, the upper shield metal USM may include a gate metal GM serving as the gate electrode GM of a transistor or scan lines SCL[n−1] and SCL[n].

Figure 18B:
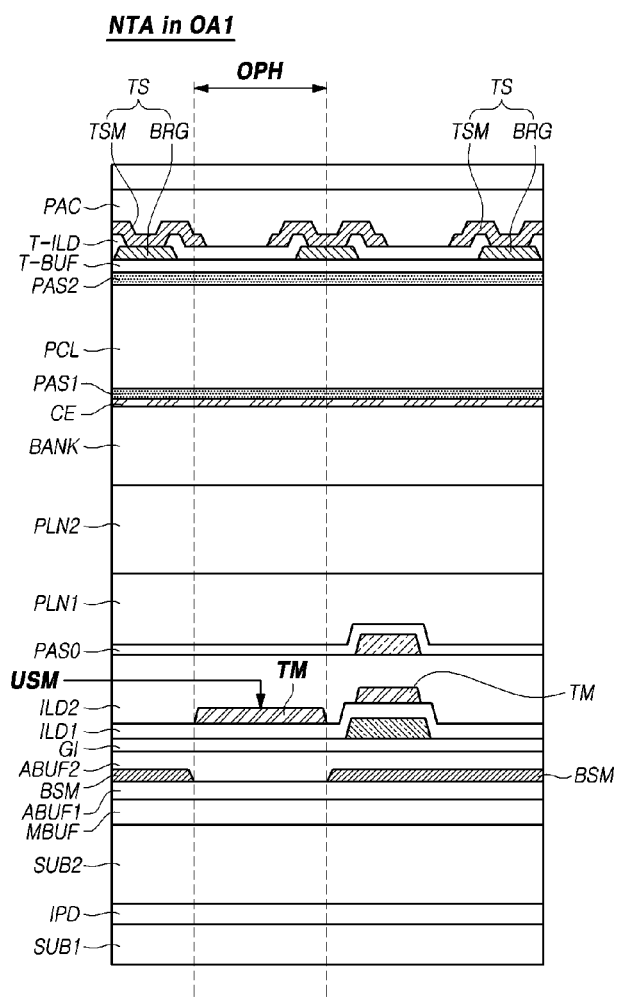

Referring to FIG. 18B, the upper shield metal USM may include a metal pattern TM on a first interlayer insulating layer ILD1.

Figure 18C:
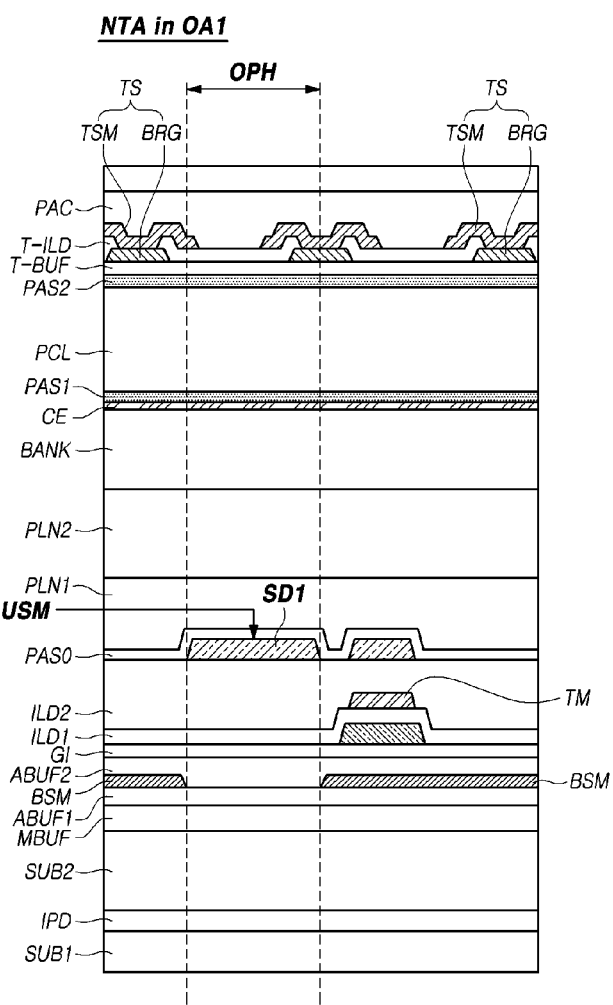

Referring to FIG. 18C, the upper shield metal USM may include a first source-drain electrode pattern SD1 for serving as source and drain electrodes of a transistor.

Figure 18D:
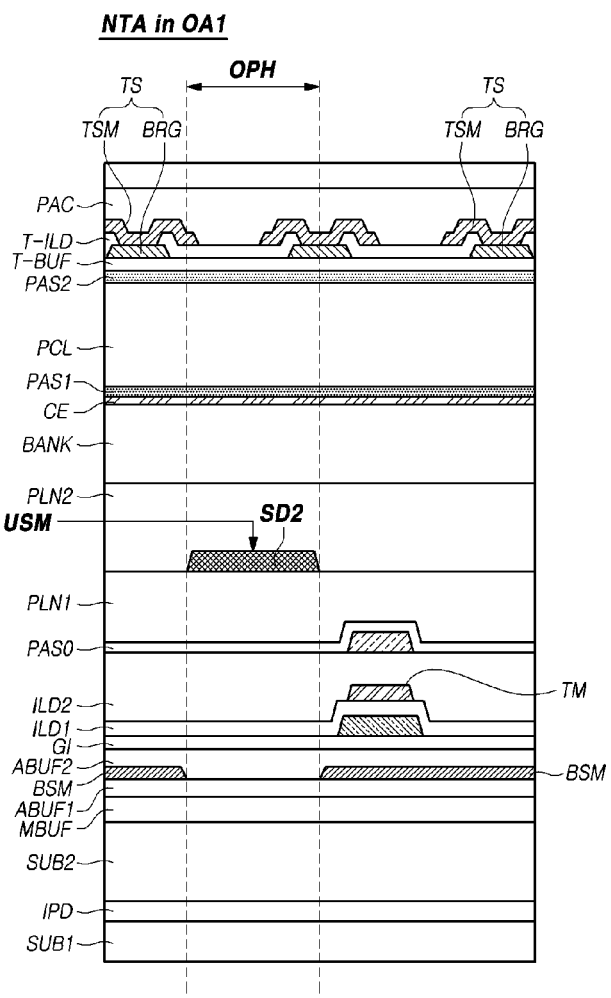

Referring to FIG. 18D, the upper shield metal USM may include a second source-drain electrode pattern SD2 for connecting the source or drain electrode of a transistor to an anode electrode AE.

Figure 18E:
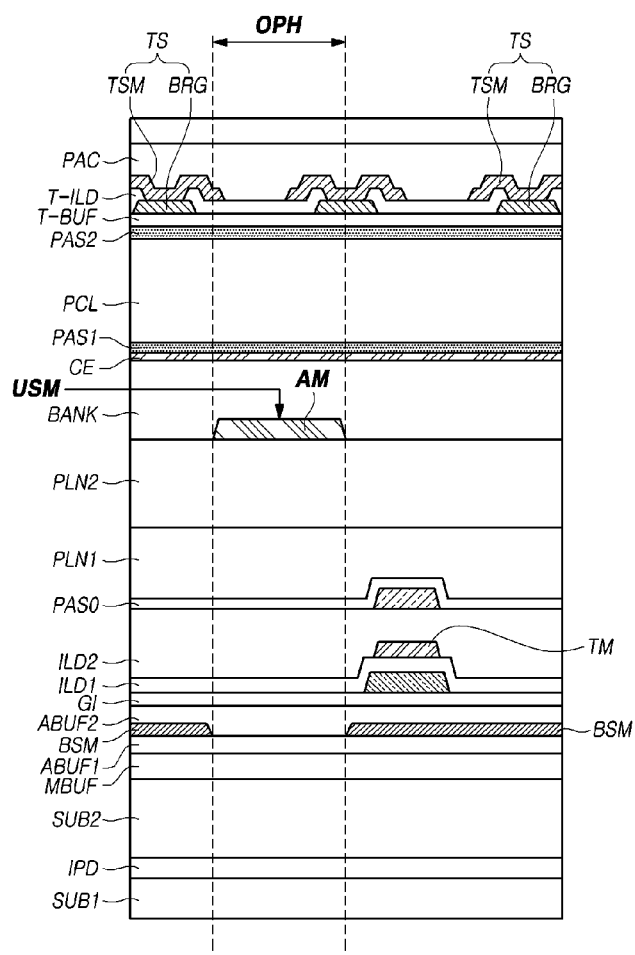

Referring to FIG. 18E, the upper shield metal USM may include an anode metal AM including an anode electrode AE or serving as the anode electrode AE.

Figure 19:
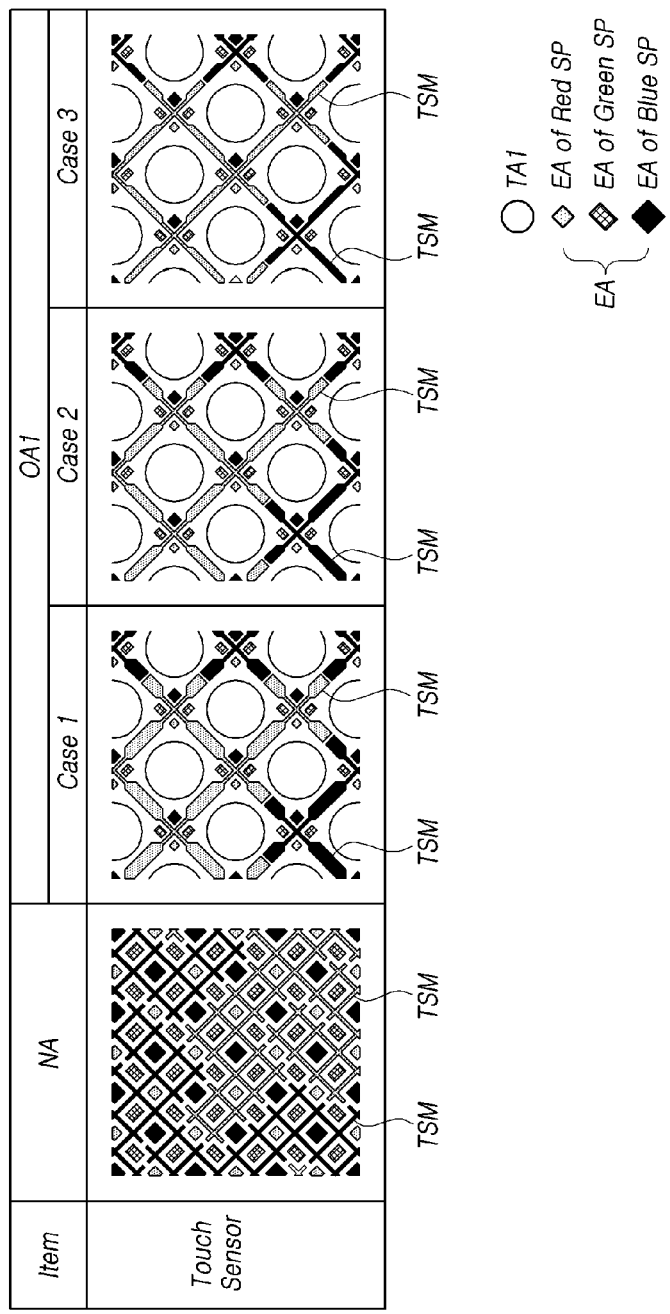
FIG. 19 illustrates an example arrangement structure of a touch sensor metal in each of the normal area and the first optical area of the display device according to an embodiment of the present disclosure.

FIG. 19 illustrates an example arrangement structure of a touch sensor metal in each of a normal area (e.g., the normal area NA in the figures discussed above) and a first optical area (e.g., the first optical area OA1 in the figures discussed above) of the display device 100 according to aspects of the present disclosure.

Figure 20:
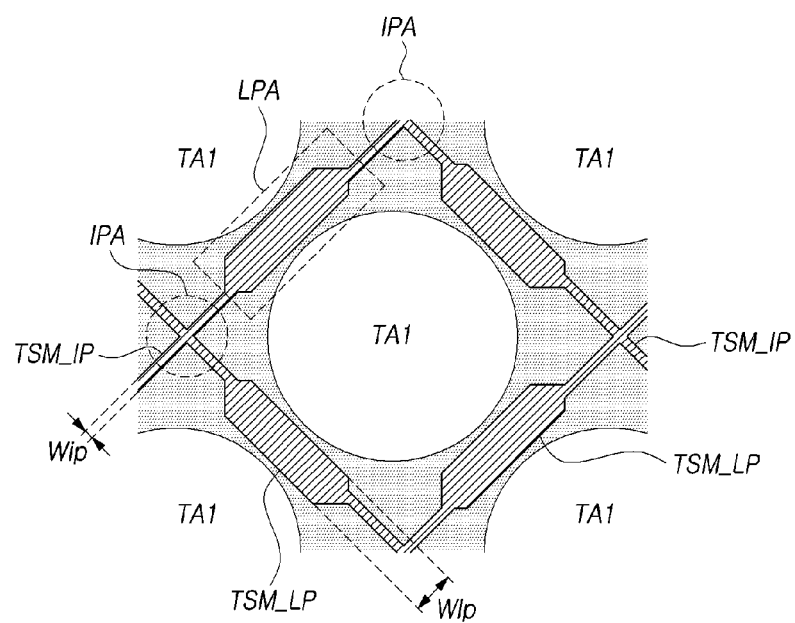
FIG. 20 is an example enlarged view of the arrangement structure of the touch sensor metal inside of the first optical area of the display device according to an embodiment of the present disclosure.

FIG. 20 is an example enlarged view of the arrangement structure of a touch sensor metal (e.g., the touch sensor metal of FIG. 19) inside of the first optical area OA1 of the display device 100 according to aspects of the present disclosure.

As described above, the display panel 110 of the display device 100 may be further include a cathode electrode (e.g., the cathode electrode CE in the figures discussed above) disposed in light emitting areas EA included in the normal area NA and the first optical area OA1 and not disposed in first transmission areas TA1 included in the first optical area OA1, and an encapsulation layer (e.g., the encapsulation layer ENCAP in the figures discussed above) disposed on the cathode electrode CE.

As described above, the display device 100 according to embodiments of the present disclosure can provide the touch sensing function. To provide this function, in an example where a touch sensor (e.g., touch sensor TS in the figures discussed above) is embedded in the display panel 110, the display panel 110 may have the vertical structure as shown in FIG. 7. In this example, the display panel 110 of the display device 100 may further include a touch sensor metal TSM with a mesh pattern located on the encapsulation layer ENCAP and forming the touch sensor TS.

Referring to FIG. 19, in some embodiments, in the normal area NA, the touch sensor metal TSM may be disposed in the mesh pattern while avoiding the light emitting areas EA. Accordingly, even when the touch sensor TS is embedded in the display panel 110, a decrease in luminous efficiency in the normal area NA can be prevented or at least reduced.

Referring to FIG. 19, in the first optical area OA1, the touch sensor metal TSM can be disposed to avoid the plurality of light emitting areas EA of the first optical area OA1 and disposed to further avoid the plurality of first transmission areas TA1 of the first optical area OA1. Thereby, touch sensing in the first optical area OA1 can be normally carried out, and in turn, a decrease in luminous efficiency and a decrease in transmittance in the first optical area OA1 can be prevented or at least reduced.

Referring to FIG. 19, the density of touch sensor metal TSM forming a plurality of mesh units in the first optical area OA1 may be less than the density of touch sensor metal TSM forming a plurality of mesh units in the normal area NA.

However, a line width of at least a portion of the touch sensor metal TSM of the first optical area OA1 may be greater than a line width of the touch sensor metal TSM of the normal area NA. For example, a maximum line width of the touch sensor metal TSM of the first optical area OA1 may be greater than a maximum line width of the touch sensor metal TSM of the normal area NA.

Accordingly, although the density of the touch sensor metal TSM forming mesh units in the first optical area OA1 is less than the density of the touch sensor metal TSM forming mesh units in the normal area NA, a capacitance needed for touch sensing through the touch sensor metal TSM in the first optical area OA1 may become a level that is similar to a capacitance needed for touch sensing through the touch sensor metal TSM in the normal area NA. Accordingly, the touch sensitivity of the first optical area OA1 can be improved.

Considering a difference between the density of the touch sensor metal TSM in the first optical area OA1 and the density of the touch sensor metal TSM in the normal area NA, as shown in Case 1, Case 2, and Case 3 in FIG. 19, the maximum line width of the touch sensor metal TSM in the first optical area OA1 can be variously adjusted.

Referring to FIG. 20, in the first optical area OA1, the touch sensor metal TSM may have, for example, the mesh pattern. According to this example, the touch sensor metal TSM in the first optical area OA1 may include intersecting parts TSM_IP in intersecting areas IPA and link parts TSM_LP in link areas LPA for connecting the intersecting parts TSM_IP.

Referring to FIG. 20, in the touch sensor metal TSM included in the first optical area OA1, a line width Wlp of each of the link parts TSM_LP may be greater than a line width Wip of each of the intersecting parts TSM_IP.

This enables not only the touch sensor metal TSM of the first optical area OA1 to maximally avoid the light emitting areas EA and the first transmission areas TA1, but a capacitance needed for touch sensing through the touch sensor metal TSM in the first optical area OA1 to reach a level remarkably similar to a capacitance needed for touch sensing through the touch sensor metal TSM in the normal area NA. Accordingly, the light emitting performance and touch sensitivity of the first optical area OA1 can be maximally improved.

In some embodiments, a plurality of first horizontal lines HL1 running through the first optical area OA1 may partially overlap the touch sensor metal TSM.

Figure 21:
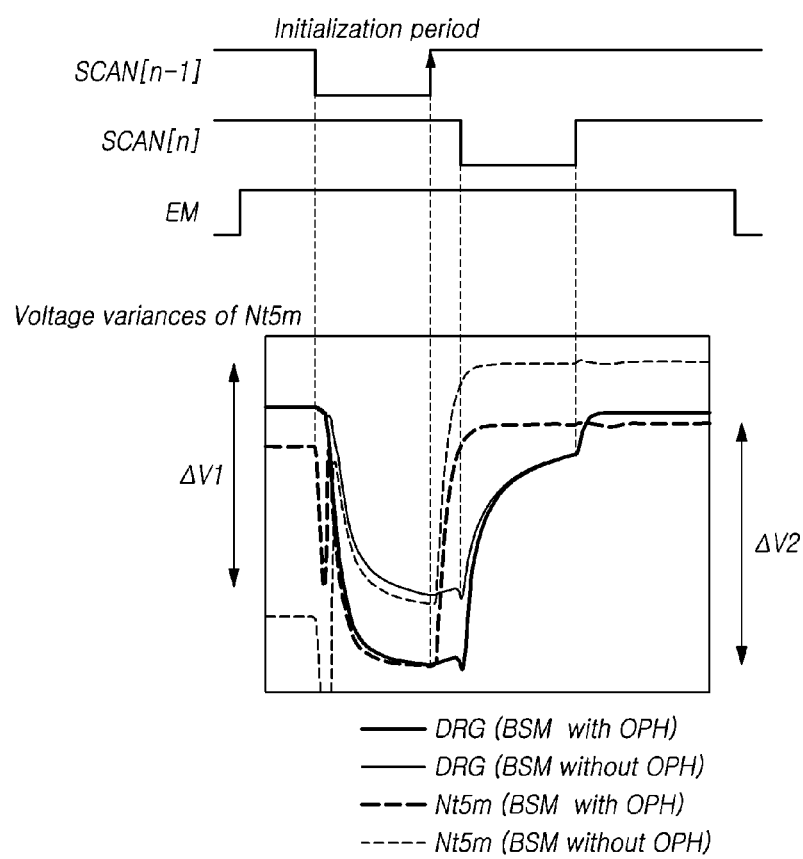
FIG. 21 is a graph illustrating changes in a voltage of a gate node and a voltage of a connection node of a driving transistor before and after an open structure of the lower shield metal is applied in the display device according to an embodiment of the present disclosure.

FIG. 21 is a graph showing changes in a voltage of a gate node DRG and a voltage of the connection node Nt5$m$ of a driving transistor DRT before and after an open structure of a lower shield metal (e.g., the lower shield metal BSM in the figures discussed above) is applied in the display device 100 according to aspects of the present disclosure.

Referring to FIG. 21, a driving period of a subpixel SP may include an initialization period, and the like. During the initialization period, the fifth transistor T5 can be turned on by a low level voltage of the second scan signal SCAN[n−1] supplied to the second scan line SCL[n−1]. Accordingly, the first initialization voltage Vini1 can be applied to the first node N1, which is the gate node DRG of the driving transistor DRT, through the turned-on fifth transistor T5.

In an example where the embodiments of the present disclosure are not applied, and thus, a lower shield metal BSM disposed in a non-transmission area NTA of the first optical area OA1 does not have an opening OPH, a phenomenon in which the threshold voltage of the fifth transistor T5 is shifted to a lower level of voltage may occur, and therefore, during the initialization period, the fifth transistor T5 may not normally perform an intended switching operation.

Accordingly, a voltage at the connection node Nt5$m$ of the fifth transistor T5 may not fall as sufficiently low as the first initialization voltage Vini1, and a voltage at the gate node DRG of the driving transistor DRT may not also fall as sufficiently low as the first initialization voltage Vini1.

In addition, after the second scan signal SCAN[n−1] rises to a high level voltage and the fifth transistor T5 is turned off, the first scan signal SCAN[n] with a low level voltage may be supplied to the first scan line (SCL[n]). Accordingly, the second transistor T2, the driving transistor DRT, and the first transistor T1 can be turned on by the first scan signal SCAN[n] with the low level voltage.

A data voltage Vdata supplied to a data line DL can be applied to the gate node DRG of the driving transistor DRT through the second transistor T2, the driving transistor DRT, and the first transistor T1, which have been turned on. Thereby, the voltage at the gate node DRG of the driving transistor DRT can increase by the data voltage Vdata.

However, since the voltage at the connection node Nt5$m$ had an abnormally high value without being normally lowered at the previous timing, the voltage at the connection node Nt5$m$, which is in a floating state, has a voltage value obtained by adding a voltage variance ($\Delta$V1) to the abnormal high voltage at the previous timing. This voltage value is an abnormal voltage value.

In contrast, in an example where the embodiments of the present disclosure are applied, and thus, a lower shield metal BSM disposed in a non-transmission area NTA of the first optical area OA1 has an opening OPH, a phenomenon in which the threshold voltage of the fifth transistor T5 is shifted to a lower level of voltage can be prevented or at least reduced, and thereby, during the initialization period, the fifth transistor T5 can normally perform an intended switching operation.

Accordingly, a voltage at the connection node Nt5$m$ of the fifth transistor T5 may fall as sufficiently low as the first initialization voltage Vini1, and a voltage at the gate node DRG of the driving transistor DRT may also fall as sufficiently low as the first initialization voltage Vini1.

In addition, after the second scan signal SCAN[n−1] rises to a high level voltage and the fifth transistor T5 is turned off, the first scan signal SCAN[n] with a low level voltage may be supplied to the first scan line (SCL[n]). Accordingly, the second transistor T2, the driving transistor DRT, and the first transistor T1 can be turned on by the first scan signal SCAN[n] with the low level voltage.

A data voltage Vdata supplied to a data line DL can be applied to the gate node DRG of the driving transistor DRT through the second transistor T2, the driving transistor DRT, and the first transistor T1, which have been turned on. Thereby, the voltage at the gate node DRG of the driving transistor DRT can increase by the data voltage Vdata.

However, since the voltage at the connection node Nt5$m$ were normally lowered at the previous timing, the voltage at the connection node Nt5$m$, which is in a floating state, has a voltage value obtained by adding a voltage variance ($\Delta$V1) to the voltage at the previous timing. This voltage value is a normal voltage value.

Figure 22:
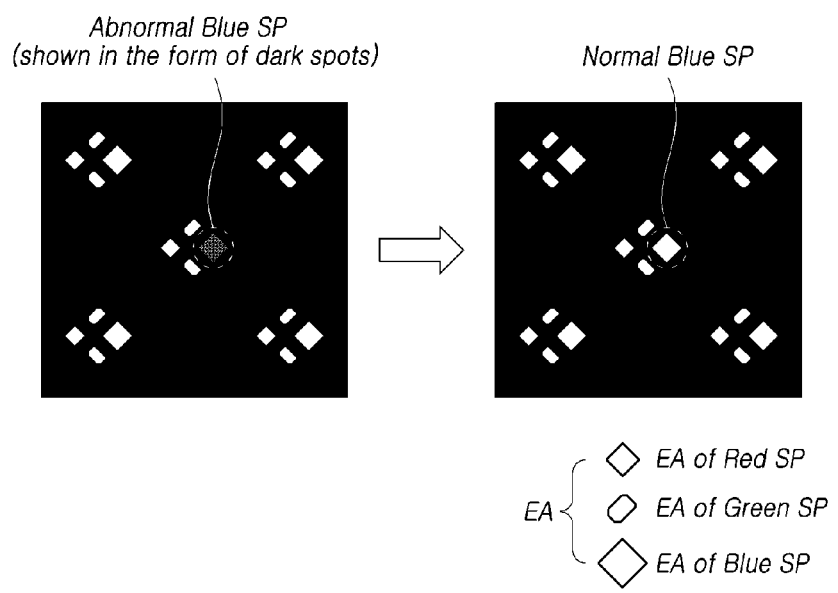
FIG. 22 illustrates a result of an example lighting experiment on the first optical area in which the open structure of the lower shield metal is applied in the display device according to an embodiment of the present disclosure.

FIG. 22 illustrates a result of an example lighting experiment on the first optical area OA1 in which the open structure of a lower shield metal (e.g., the lower shield metal BSM in the figures discussed above) is applied in the display device 100 according to aspects of the present disclosure.

Referring to FIG. 22, the lower shield metal BSM disposed in a non-transmission area NTA of the first optical area OA1 may have an opening OPH.

In the example where the open structure of the lower shield metal BSM is applied, even when a driving voltage ELVDD is applied to the lower shield metal BSM to form the storage capacitor Cst, the threshold voltage of the fifth transistor T5 located over the lower shield metal to which the driving voltage ELVDD is applied can be prevented from shifting to a lower level of voltage.

In a result of a lighting experiment on an example where the open structure of the lower shield metal BSM is not applied (e.g., the example of FIG. 14), it has been observed that a blue subpixel SP including the fifth transistor T5, which has a threshold voltage shifted to a lower level of voltage, is shown in the form of dark spots.

In a situation where the same lighting experiment environment is maintained, a lighting experiment have been performed on an example where the lower shield metal BSM disposed in the non-transmission area NTA of the first optical area OA1 is designed to have an opening OPH overlapping all or a portion of the fifth transistor T5. As a result, as shown in FIG. 22, it has been observed that the shifting of the threshold voltage of the fifth transistor T5 to a lower level of voltage is prevented, and in turn, the displaying of the corresponding subpixel SP is normally performed as the subpixel SP is prevented from being shown in the form of dark spots.

As described above, the lower shield metal BSM in the non-transmission area NTA of the first optical area OA1 may have an open structure in which at least one opening OPH is present in an area overlapping all or a portion of a specific transistor (e.g., the fifth transistor T5).

In one embodiment, the open structure of the lower shield metal BSM in the non-transmission area NTA of the first optical area OA1 may be substantially equally applied to the normal area NA. For example, a lower shield metal BSM may be also disposed in the normal area NA, and the lower shield metal BSM disposed in the normal area NA may have at least one opening OPH in an area corresponding to a specific transistor (e.g., the fifth transistor T5) of each subpixel SP included in the normal area NA.

In another embodiment, the open structure of the lower shield metal BSM in the non-transmission area NTA of the first optical area OA1 may not be applied, or may be differently applied, to the normal area NA.

For example, a lower shield metal BSM may be disposed only in the first optical area OA1 and the second optical area OA2, and may not be disposed in the normal area NA. In another example, a lower shield metal BSM may be disposed in the normal area NA, and the lower shield metal BSM disposed in the normal area NA may not have an opening OPH. In further another example, a location, size, or shape of an opening OPH of a lower shield metal BSM disposed in the normal area NA may be different from a location, size, or shape of the opening OPH of the lower shield metal BSM in the non-transmission area NTA of the first optical area OA1.

The open structure of the lower shield metal BSM in the first optical area OA1 may be substantially equally applied to the second optical area OA2. For example, a lower shield metal BSM in a non-transmission area NTA of the second optical area OA2 may have an open structure in which at least one opening OPH is present in an area overlapping all or a portion of a specific transistor (e.g., the fifth transistor T5). It should be noted that the above discussions had been provided only based on the first optical area OA1 for convenience of description, and thus, that the scope of the present disclosure includes embodiments where the lower shield metal BSM in the non-transmission area NTA of the second optical area OA2 has an open structure configured to have at least one opening OPH.

The embodiments of the touch display device 100 according to aspects of the present disclosure described above can be briefly discussed as follows.

According to aspects of the present disclosure, a display device is provided that includes: a display panel that includes a display area including an optical area and a normal area located outside of the optical area, and a non-display area, the optical area including a plurality of light emitting areas and a plurality of transmission areas, and the normal area including a plurality of light emitting areas; and an optical electronic device located under, in a lower portion of, the display panel and overlapping at least a portion of the optical area.

The display panel may further include two or more subpixels disposed in a non-transmission area between adjacent transmission areas in the optical area, and a lower shield metal disposed in the non-transmission area.

Each of the two or more subpixels SP may include a light emitting element ED, two or more transistors, and a storage capacitor.

The lower shield metal may include at least one opening, and the at least one opening may overlap all or at least a portion of a specific transistor among the two or more transistors included in each of the two or more subpixels.

The specific transistor may be a transistor for transmitting a first initialization voltage to a first node of a driving transistor.

The specific transistor may be a dual transistor including two channels overlapping one scan line and a connection node between the two channels.

First and second subpixels among the two or more subpixels SP may be disposed in the non-transmission area between adjacent transmission areas in the optical area.

In the non-transmission area between adjacent transmission areas in the optical area, the lower shield metal may include an opening extending across a first circuit portion of the first subpixel and a second circuit portion of the second subpixel.

The one opening may overlap two channels and a connection node of a specific transistor included in the first circuit portion of the first subpixel, and may overlap two channels and a connection node of a specific transistor included in the second circuit portion of the second subpixel SP.

The one opening may overlap two channels of a specific transistor included in the first circuit portion of the first subpixel, overlap two channels of a specific transistor included in the second circuit portion of the second subpixel, not overlap a connection node of the specific transistor included in the first circuit portion of the first subpixel, and not overlap a connection node of the specific transistor included in the second circuit portion of the second subpixel.

First and second subpixels among the two or more subpixels SP may be disposed in the non-transmission area between adjacent transmission areas in the optical area.

In the non-transmission area between adjacent transmission areas in the optical area, the lower shield metal may include a first opening overlapping a portion of a first circuit portion of the first subpixel and a second opening overlapping a portion of a second circuit portion of the second subpixel.

In one embodiment, the first opening may overlap two channels and a connection node of a specific transistor included in the first circuit portion of the first subpixel. Further, the second opening may overlap two channels and a connection node of a specific transistor included in the second circuit portion of the second subpixel.

In another embodiment, the first opening may overlap two channels of a specific transistor included in the first circuit portion of the first subpixel, and not overlap a connection node of the specific transistor included in the first circuit portion of the first subpixel. Further, the first opening may overlap two channels of a specific transistor included in the second circuit portion of the second subpixel, and not overlap a connection node of the specific transistor included in the second circuit portion of the second subpixel.

The display panel may further include an upper shield metal overlapping at least one opening of the lower shield metal.

The display panel may further include an encapsulation layer on the light emitting element, and a touch sensor metal with a mesh pattern on the encapsulation layer. The touch sensor metal may be disposed to avoid a plurality of light emitting areas of the normal area. The touch sensor metal may be disposed to avoid a plurality of transmission areas and a plurality of light emitting areas included in the optical area.

The upper shield metal may include a touch sensor metal.

A touch sensor metal in the optical area may include a portion having a greater line width than a touch sensor metal in the normal area.

The touch sensor metal may include intersecting parts and link parts for connecting the intersecting parts, and a line width of each of the link parts may be greater than a line width of each of the intersecting parts.

Each of the two or more subpixels disposed in the non-transmission area between adjacent transmission areas in the optical area may include a circuit portion for driving a corresponding light emitting element. The circuit portion may include: a driving transistor including a first node, a second node, and a third node, and configured to drive the light emitting element; a first transistor for controlling a connection between the first and second nodes of the driving transistor; a second transistor for controlling a connection between the third node of the driving transistor and a data line; a third transistor for controlling a connection between the third node of the driving transistor and a driving voltage line; a fourth transistor for controlling a connection between the light emitting element and the second node of the driving transistor; a fifth transistor for controlling a connection between an initialization voltage line and the first node of the driving transistor; a sixth transistor for controlling a connection between the light emitting element and a second initialization voltage line; and a storage capacitor connected between the first node of the driving transistor and the driving voltage line.

The specific transistor may be the fifth transistor.

The fifth transistor may include a first electrode electrically connected to the first initialization voltage line, a second electrode electrically connected to the first node of the driving transistor, and an active layer including a first conductive portion, a second conductive portion, a first channel region, a second channel region, and a connection conductive portion.

The first conductive portion may be electrically connected to the first electrode. The second conductive portion may be electrically connected to the second electrode.

The first channel region may be located between the first conductive portion and the connection conductive portion. The second channel region may be located between the second conductive portion and the connection conductive portion.

The connection conductive portion may be located between the first channel region and the second channel region. The connection conductive portion may at least partially overlap the first initialization voltage line.

The first channel region and the second channel region may overlap one scan line, for example, first and second portions thereof, respectively.

According to aspects of the present disclosure, a display panel is provided that includes a substrate including a display area including an optical area and a normal area located outside of the optical area, and a non-display area, a lower shield metal over the substrate, a buffer layer on the lower shield metal, and a transistor layer on the buffer layer.

The optical area may include a plurality of light emitting areas and a plurality of transmission areas, and at least a portion of the optical area may overlap an optical electronic device located under of the substrate.

Two or more subpixels may be disposed in a non-transmission area between adjacent transmission areas in the optical area, and each of the two or more subpixels may include a light emitting element, two or more transistors, and a storage capacitor.

The lower shield metal may be disposed in the non-transmission area and include at least one opening.

The at least one opening of the lower shield metal may overlap all or at least a portion of a specific transistor among the two or more transistors included in each of the two or more subpixels.

The specific transistor may be a dual transistor including two channels overlapping one scan line and a connection node between the two channels.

In one embodiment, the open structure of the lower shield metal in which the lower shield metal in the non-transmission area of the optical area has at least one opening may be substantially equally applied to the normal area.

In another embodiment, the open structure of the lower shield metal in which the lower shield metal in the non-transmission area of the optical area has at least one opening may not be applied to the normal area, or may be differently applied to the normal area.

First and second subpixels among the two or more subpixels SP may be disposed in the non-transmission area between adjacent transmission areas in the optical area.

In the non-transmission area between adjacent transmission areas in the optical area, the lower shield metal may include an opening extending across a first circuit portion of the first subpixel and a second circuit portion of the second subpixel.

First and second subpixels among the two or more subpixels SP may be disposed in the non-transmission area between adjacent transmission areas in the optical area.

In the non-transmission area between adjacent transmission areas in the optical area, the lower shield metal may include a first opening overlapping a portion of a first circuit portion of the first subpixel and a second opening overlapping a portion of a second circuit portion of the second subpixel.

The display panel may further include an upper shield metal overlapping at least one opening of the lower shield metal and located in a higher layer than a layer in which the lower shield metal is located.

The optical electronic device may include one or more of a camera and a sensor.

In one embodiment, the optical area may be one of a first optical area and a second optical area.

In another embodiment, the optical area may include all of the first optical area and the second optical area. In this embodiment, the number of subpixels per unit area in the first optical area may be less than the number of subpixels per unit area in the normal area. The number of subpixels per unit area in the second optical area may be equal to or greater than the number of subpixels per unit area in the first optical area, and be less than the number of subpixels per unit area in the normal area.

According to one or more embodiments described herein, a display panel (e.g., the display panel 110 in the figures discussed above) and a display device (e.g., the display device 100 in the figures discussed above) can be provided that are capable of reducing a non-display area of the display panel and enabling an optical electronic device such as a camera, a sensor, and the like not to be exposed in the front surface of the display panel by disposing the optical electronic device under a display area of the display panel.

According to one or more embodiments described herein, a display panel (e.g., the display panel 110 in the figures discussed above) and a display device (e.g., the display device 100 in the figures discussed above) can be provided that have a light transmission structure of enabling an optical electronic device located under a display area of the display panel to normally receive light transmitting the display panel.

According to one or more embodiments described herein, a display panel (e.g., the display panel 110 in the figures discussed above) and a display device (e.g., the display device 100 in the figures discussed above) can be provided that are capable of normally performing display driving in an optical area included in a display area of the display panel and overlapping an optical electronic device.

According to one or more embodiments described herein, a display panel (e.g., the display panel 110 in the figures discussed above) and a display device (e.g., the display device 100 in the figures discussed above) can be provided that include a lower shield metal having an open structure capable of preventing an abnormal image from being displayed while increasing transmittance of an optical area.

According to one or more embodiments described herein, a display panel (e.g., the display panel 110 in the figures discussed above) and a display device (e.g., the display device 100 in the figures discussed above) can be provided that include a lower shield metal having an open structure capable of preventing an abnormal image from being displayed while increasing transmittance of an optical area, and have an upper shield structure capable of preventing flare and haze phenomena in the optical area.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein may be applied to other embodiments and applications without departing from the scope of the present invention. The above description and the accompanying drawings provide examples of the technical features of the present invention for illustrative purposes only. That is, the disclosed embodiments are intended to illustrate the scope of the technical features of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device comprising:
   a display panel comprising a display area that is configured to display an image and a non-display area, the display area comprising an optical area and a normal area located outside of the optical area, wherein the optical area includes a first plurality of light emitting areas, a plurality of transmission areas, and a non-transmission area between adjacent transmission areas from the plurality of transmission areas, and the normal area including a second plurality of light emitting areas;
   two or more subpixels disposed in the non-transmission area of the optical area, each of the two or more subpixels including a light emitting element, two or more transistors, and a storage capacitor; and
   a lower shield metal in the non-transmission area of the optical area, the lower shield metal comprising at least one opening that overlaps all or at least a portion of a specific transistor among the two or more transistors included in each of the two or more subpixels.

2. The display device according to claim 1, wherein the specific transistor is a transistor configured to transmit a first initialization voltage to a first node of a driving transistor included in the two or more transistors.

3. The display device according to claim 1, wherein the specific transistor is a dual transistor including two channels overlapping a scan line and a connection node between the two channels.

4. The display device according to claim 3, wherein a first subpixel and a second subpixel among the two or more subpixels are disposed in the non-transmission area between the adjacent transmission areas, and the lower shield metal comprises one opening extending across a first circuit portion of the first subpixel and a second circuit portion of the second subpixel.

5. The display device according to claim 4, wherein the one opening overlaps the two channels and the connection node of the specific transistor included in the first circuit portion of the first subpixel, and overlaps the two channels and the connection node of the specific transistor included in the second circuit portion of the second subpixel.

6. The display device according to claim 4, wherein the one opening overlaps the two channels of the specific transistor included in the first circuit portion of the first subpixel, overlaps the two channels of the specific transistor included in the second circuit portion of the second subpixel, but is non-overlapping with the connection node of the specific transistor included in the first circuit portion of the first subpixel, and is non-overlapping with the connection node of the specific transistor included in the second circuit portion of the second subpixel.

7. The display device according to claim 3, wherein a first subpixel and a second subpixel among the two or more subpixels are disposed in the transmission area between the adjacent transmission areas, and the lower shield metal comprises a first opening overlapping a portion of a first circuit portion of the first subpixel, and a second opening overlapping a portion of a second circuit portion of the second subpixel.

8. The display device according to claim 7, wherein the first opening overlaps the two channels and the connection node of the specific transistor included in the first circuit portion of the first subpixel, and the second opening overlaps the two channels and the connection node of the specific transistor included in the second circuit portion of the second subpixel.

9. The display device according to claim 7, wherein the first opening overlaps the two channels of the specific transistor included in the first circuit portion of the first subpixel, but is non-overlapping with the connection node of the specific transistor included in the first circuit portion of the first subpixel, and the second opening overlaps the two channels of the specific transistor included in the second circuit portion of the second subpixel, but is non-overlapping with the connection node of the specific transistor included in the second circuit portion of the second subpixel.

10. The display device according to claim 1, wherein the display panel further comprises:
   an upper shield metal overlapping the at least one opening of the lower shield metal, the upper shield metal including at least one of a gate metal of a gate electrode of at least one of the two or more transistors, a source-drain metal of a source electrode of at least one of the two or more transistors, an anode electrode metal of an anode electrode of the light emitting element, or another metal.

11. The display device according to claim 1, wherein the display panel further comprises:
   an encapsulation layer on the light emitting element;
   a touch sensor metal on the encapsulation layer; and
   an upper shield metal overlapping the at least one opening of the lower shield metal, the upper shield metal comprising the touch sensor metal,
   wherein the touch sensor metal is non-overlapping with the plurality of light emitting areas of the normal area, and is non-overlapping with the plurality of light emitting areas and the plurality of transmission areas included in the optical area,
   wherein a portion of the touch sensor metal in the optical area comprises a line width that is greater than a line width of a touch sensor metal in the normal area, and
   wherein the touch sensor metal comprises intersecting parts and link parts that connect together the intersecting parts, and a line width of each of the link parts is greater than a line width of each of the intersecting parts.

12. The display device according to claim 9, wherein each of the two or more subpixels comprises a circuit portion configured to drive the respective light emitting element, the circuit portion comprising:
   a driving transistor including a first node, a second node, and a third node, the driving transistor configured to drive the light emitting element;
   a first transistor configured to control a connection between the first node and the second node of the driving transistor;
   a second transistor configured to control a connection between the third node of the driving transistor and a data line;
   a third transistor configured to control a connection between the third node of the driving transistor and a driving voltage line;
   a fourth transistor configured to control a connection between the light emitting element and the second node of the driving transistor;
   a fifth transistor configured to control a connection between an initialization voltage line and the first node of the driving transistor;
   a sixth transistor configured to control a connection between the light emitting element and a second initialization voltage line; and
   a storage capacitor connected between the first node of the driving transistor and the driving voltage line, and
   wherein the fifth transistor is the specific transistor.

13. The display device according to claim 12, wherein the fifth transistor comprises:
   a first electrode electrically connected to the first initialization voltage line;
   a second electrode electrically connected to the first node of the driving transistor; and
   an active layer comprising a first conductive portion that is electrically connected to the first electrode, a second conductive portion that is electrically connected to the second electrode, a connection conductive portion, a first channel region between the first conductive portion and the connection conductive portion, and a second channel region between the second conductive portion and the connection conductive portion,
   wherein the connection conductive portion is between the first channel region and the second channel region and the connection conductive portion overlaps the first initialization voltage line; and
   wherein the first channel region and the second channel region overlap one scan line.

14. The display device according to claim 1, further comprising:
   an optical electronic device that is under, or in a lower portion of the display panel, the optical electronic device overlapping at least a portion of the optical area,
   wherein the optical electronic device comprises one or more of a camera and a sensor.

15. The display device according to claim 1, wherein the optical area comprises a first optical area and a second optical area, and
   wherein a number of subpixels per unit area in the first optical area is less than a number of subpixels per unit area in the normal area, and a number of subpixels per unit area in the second optical area is greater than or equal to the number of subpixels per unit area in the first optical area, and is less than the number of subpixels per unit area in the normal area.

16. A display panel comprising:
   a substrate comprising a display area that is configured to display an image and a non-display area, the display area including an optical area and a normal area located outside of the optical area;
   a lower shield metal over the substrate;
   a buffer layer on the lower shield metal; and
   a transistor layer on the buffer layer,
   wherein the optical area comprises a plurality of light emitting areas and a plurality of transmission areas, at least a portion of the optical area overlapping an optical electronic device located under the substrate,
   wherein two or more subpixels are disposed in a non-transmission area between adjacent transmission areas in the optical area, each of the two or more subpixels comprises a light emitting element, two or more transistors, and a storage capacitor, and
   wherein the lower shield metal is in the non-transmission area and comprises at least one opening that overlaps all or at least a portion of a specific transistor among the two or more transistors included in each of the two or more subpixels.

17. The display panel according to claim 16, wherein the specific transistor is a dual transistor including two channels that overlap one scan line and a connection node between the two channels.

18. The display panel according to claim 16, further comprising:
   an upper shield metal overlapping the at least one opening of the lower shield metal, the upper shield metal farther from the substrate than the lower shield metal.

* * * * *